(12) United States Patent
Takeuchi et al.

(10) Patent No.: US 6,301,153 B1
(45) Date of Patent: Oct. 9, 2001

(54) NONVOLATILE SEMICONDUCTOR MEMORY DEVICE

(75) Inventors: Ken Takeuchi, Tokyo; Tomoharu Tanaka, Yokohama, both of (JP)

(73) Assignee: Kabushiki Kaisha Toshiba, Kawasaki (JP)

( * ) Notice: Subject to any disclaimer, the term of this patent is extended or adjusted under 35 U.S.C. 154(b) by 0 days.

(21) Appl. No.: 09/511,915

(22) Filed: Feb. 23, 2000

Related U.S. Application Data

(63) Continuation of application No. 09/069,854, filed on Apr. 30, 1998, now Pat. No. 6,055,188.

(30) Foreign Application Priority Data

Apr. 30, 1997 (JP) .................................................. 9-112776

(51) Int. Cl.[7] .................................................. G11C 16/04
(52) U.S. Cl. ................................ 365/185.11; 365/185.03; 365/185.17
(58) Field of Search ........................ 365/185.22, 185.03, 365/185.17, 185.11

(56) References Cited

U.S. PATENT DOCUMENTS

| 5,521,865 | 5/1996 | Ohuchi et al. | 365/185.22 |
|---|---|---|---|
| 5,652,719 | 7/1997 | Tanaka et al. | 365/185.22 |

FOREIGN PATENT DOCUMENTS

| 5-128878 | 11/1991 | (JP) . |
|---|---|---|
| 8-77782 | 3/1996 | (JP) . |

OTHER PUBLICATIONS

Kang–Deog Suh, et al: A 3.3 V 32 Mb NAND Flash Memory with Incremental Step Pulse Programming Scheme; *Journal of Solid–State Circuits* vol. 30; pp. 1149–1156, Nov. 1995.

*Primary Examiner*—Vu A. Le
(74) *Attorney, Agent, or Firm*—Banner & Witcoff, Ltd.

(57) ABSTRACT

A memory cell array includes first and second memory cell groups which are simultaneously selected at the time of erasing. A first bit line is connected to the first memory cell group and a second bit line is connected to the second memory cell group. The first and second bit lines are commonly connected to a data circuit having a latch circuit. First data read from the first memory cell group at the time of erase verify read for the first memory cell group is input to the data circuit and second data read from the second memory cell group at the time of erase verify read for the second memory cell group is input to the data circuit. The data circuit latches data indicating that the erasing operation is completed into the latch circuit when both of the first and second data items indicate that the erasing states of the memory cells are sufficient and latches data indicating that the erasing operation is effected again into the latch circuit when at least one of the first and second data items indicates that the erasing state of the memory cell is insufficient.

34 Claims, 24 Drawing Sheets

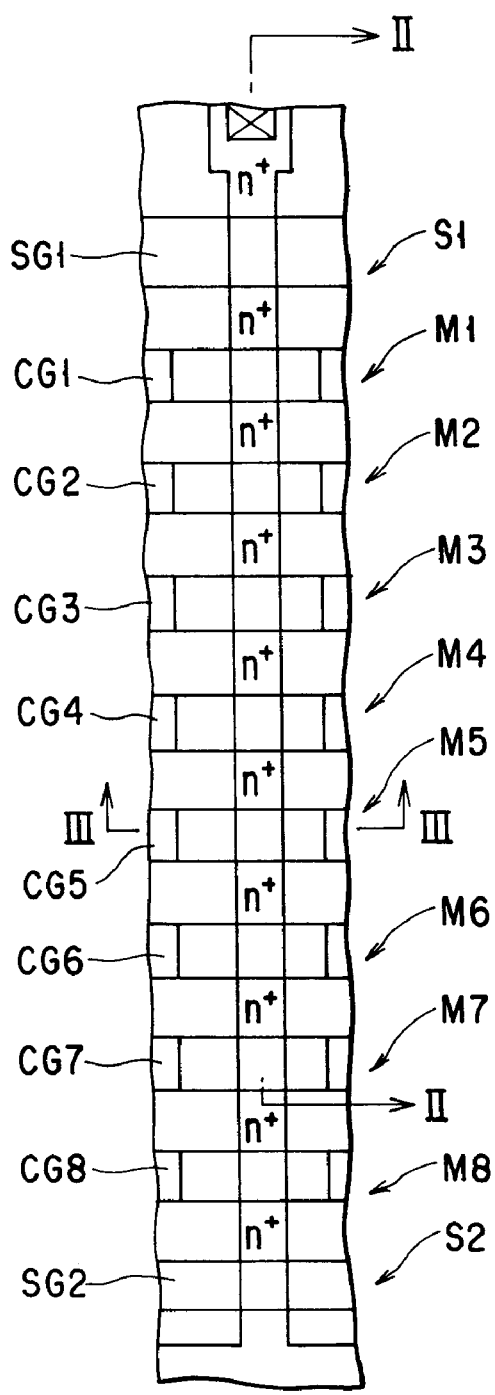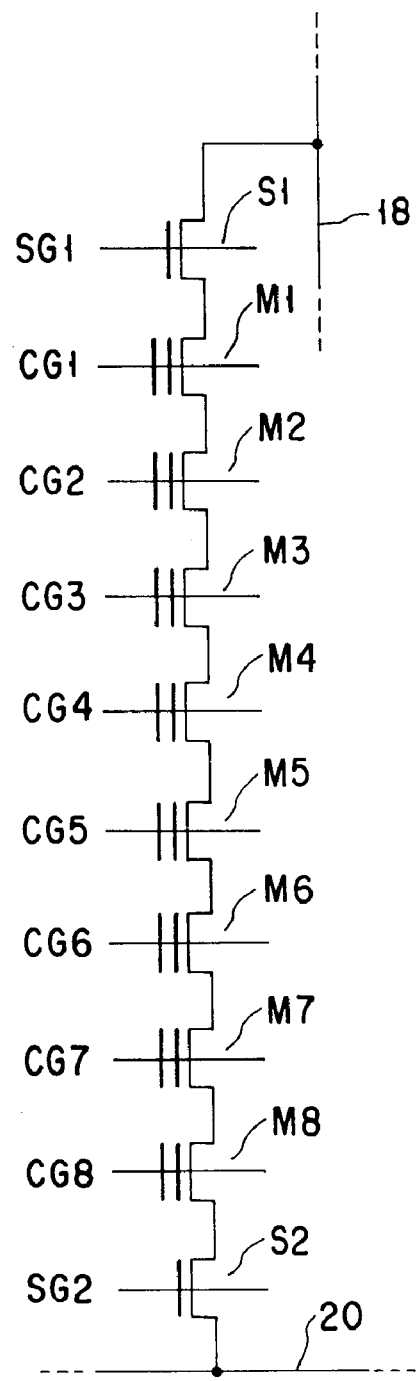
(PRIOR ART)
FIG. 1
(PRIOR ART)
FIG. 4

NONVOLATILE SEMICONDUCTOR MEMORY DEVICE

This application is a continuation of prior application Ser. No. 09/069,854, filed Apr. 30, 1998, U.S. Pat. No. 6,055,188.

BACKGROUND OF THE INVENTION

This invention relates to an EEPROM (Electrically Erasable PROM).

In recent years, as one type of the EEPROMs, a NAND type flash EEPROM has been proposed.

The above EEPROM includes NAND cell lines each having a plurality of serially connected memory cells and two select transistors connected to both ends of the NAND cell line. When the NAND cell line and the select transistors are considered as one unit, a plurality of units are connected to one bit line. The memory cell has a stack gate structure including a floating gate electrode and a control gate electrode.

FIG. 1 shows one unit forming part of the memory cell array. FIG. 2 is a cross sectional view taken along the line II—II of FIG. 1. FIG. 3 is a cross sectional view taken along the line III—III of FIG. 1.

A field oxide film 12 formed by the LOCOS method is disposed on a p-type silicon substrate (or p-type well) 11. An area in which the field oxide film 12 is formed is an element isolation region and an area in which the field oxide film 12 is not formed is an element region.

In the element region, a plurality of memory cells forming the NAND cell lines are disposed. If attention is paid to one NAND cell line, eight memory cells M1 to M8 are serially connected in this example. Each memory cell includes a gate insulating film 13 on the silicon substrate 11, a floating gate electrode 14 on the gate insulating film 13, an insulating film 15 on the floating gate electrode 14, and a control gate electrode 16 on the insulating film 15. Each memory cell includes n-type diffusion layers 19 acting as source and drain regions. The n-type diffusion layer 19 in the NAND cell line is commonly used by two adjacent memory cells.

A drain side select transistor S1 is connected between the NAND cell line and the bit line 18 and a source side select transistor S2 is connected between the NAND cell line and the source line. The select transistors S1, S2 respectively include select gate electrodes 14, 16 and n-type diffusion layers 19.

An interlayer insulator 17 covering the memory cells constructing the NAND cell line is formed on the silicon substrate 11. A contact hole which reaches the n-type diffusion layer (drain) of the select transistor S1 is formed in the interlayer insulator 17. The bit line 18 is disposed on the interlayer insulator 17 and connected to the n-type diffusion layer (drain) of the select transistor S1 via the contact hole.

Control gate electrodes of a plurality of memory cells in one row are integrally formed to construct one word line. The control gate electrodes (word lines) CG1, CG2, . . . , CG8 extend in the row direction. The select gate electrodes SG1, SG2 of the select transistors S1, S2 are also extend in the row direction.

FIG. 4 shows an equivalent circuit of the NAND cell line of FIG. 1. FIG. 5 shows part of the memory cell array containing a plurality of NAND cell lines.

Source lines 20 extend in the row direction and are connected to the source side nodes of the NAND cell lines via the select transistors S2. Reference potential lines 21 extend in the column direction and are arranged with 64 bit lines BL0 to BL63 disposed therebetween, for example. Each of the source lines 20 is connected to the reference potential lines 21 in each position where it extends across the 64 bit lines BL0 to BL63, for example. The reference potential lines 21 are connected to peripheral circuits. The control gate electrodes CG1 to CG8 of the memory cell and the gate electrodes SG1, SG2 of the select transistors extend in the row direction.

Normally, a set of memory cells connected to one control gate electrode (word line) is called one page and a set of pages (in this example, 8 pages) disposed between the drain side select transistor S1 and the source side select transistor S2 is called one NAND block or simply one block.

For example, one page is constructed by memory cells of 256 bytes (256×8 bits). Data is almost simultaneously written into the memory cells in one page. One block is constructed by memory cells of 2048 bytes (2048×8 bits). Data is almost simultaneously erased for the memory cells in one block.

The operation of the NAND type flash EEPROM is as follows.

Data writing is effected by sequentially selecting memory cells one by one starting from the memory cell which lies farthest from the bit line to the memory cell which lies nearest to the bit line among the memory cells in the NAND cell line and writing data into the selected memory cell.

A write potential Vpp (for example, approx. 20 V) which is higher than the power supply potential is applied to the control gate electrode of the selected memory cell and an intermediate potential (for example, approx. 10 V) is applied to the control gate electrodes of the non-selected memory cells. Further, an intermediate potential (for example, approx. 10 V) is applied to the gate electrode SG1 of the drain side select transistor S1, and 0 V ("0" writing) or intermediate potential ("1" writing) is applied to the bit line BLi according to the written data.

The potential of the bit line BLi is transmitted to the selected memory cell. In the case of "0" writing, since a high voltage is applied between the floating gate electrode of the selected memory cell and the silicon substrate (channel), electrons move from the silicon substrate to the floating gate electrode by the tunnel effect. If electrons are injected into the floating gate electrode, the threshold value of the memory cell is shifted in the positive direction.

On the other hand, in the case of "1" writing, electrons will not move from the silicon substrate to the floating gate electrode and the threshold value of the memory cell is kept unchanged.

Data erasing is almost simultaneously effected for all of the memory cells in at least one selected block. In the selected block, 0 V is applied to all of the control gate electrodes CG1 to CG8 and the gate electrodes SG1, SG2 of the select transistors S1, S2 and a high potential VppE (for example, approx. 20 V) is applied to the n-type substrate and p-type well in which the memory cells are arranged.

As a result, in the memory cells in the selected block, electrons are discharged from the floating gate electrodes to the p-type well to shift the threshold voltage in the negative direction.

In the non-selected block, the high potential VppE is applied to all of the control gate electrodes CG1 to CG8 and the gate electrodes SG1, SG2 of the select transistors S1, S2 and the high potential VppE is also applied to the n-type substrate and p-type well in which the memory cells are arranged. Therefore, the threshold values of the memory cell in the non-selected block are kept unchanged.

Data read is almost simultaneously effected for memory cells of one page. After the bit line BLi is set to a precharge potential and set into an electrically floating state, the control gate electrode of the selected memory cell is set to 0 V, the control gate electrodes of the non-selected memory cells are set to a power supply potential Vcc (for example, approx. 3 V), the gate electrodes of the select transistors are set to the power supply potential Vcc, and the source lines are set to 0 V.

At this time, if data in the selected memory cell is "1" (the threshold vth is less than 0 V), the selected memory cell is turned ON. If the selected memory cell is turned ON, the potential of the bit line BLi is lowered. On the other hand, if data of the selected memory cell is "0" (the threshold value exceeds 0 V), the selected memory cell is turned OFF. If the selected memory cell is turned OFF, the potential of the bit line BLi is kept at the precharge potential.

That is, data read of the memory cell is effected by detecting the potential of the bit line BLi by use of a sense amplifier (or a latch circuit having a sense amplifier function).

In the NAND type flash EEPROM described above, a case wherein one sense amplifier is commonly used by (or commonly connected to) a plurality of bit lines is considered below.

In this case, memory cells connected to a plurality of bit lines connected to one sense amplifier are subjected to the erasing operation at substantially the same time. However, the erase verify read operation effected after the erasing operation cannot be effected at substantially the same time for the memory cells connected to the plurality of bit lines connected to one sense amplifier. This is because two or more data cannot be given to one sense amplifier.

Therefore, if one sense amplifier is commonly used by k (k is a natural number equal to or larger than 2) bit lines, time for the erase verify read becomes k times that in a case wherein one sense amplifier is used by one bit line.

Recently, in the NAND type flash EEPROM, a so-called multi-level type EEPROM for storing data of 3 levels or more in one memory cell is known as a means for realizing a large data storage capacity (for example, Japanese Patent Application Nos. 7-93979, 5-311732).

In the EEPROM, generally, a data circuit for holding write data or read data is constructed by a latch circuit (or latch circuit having sense amplifier function). When multi-level write data or read data is held, the data circuit has two or more latch circuits (for example, Japanese Patent Application Nos. 7-93979, 5-311732).

Therefore, in the multi-level type EEPROM, it is necessary to commonly use one data circuit by a plurality of bit lines in order to prevent an increase in the area of the peripheral circuit of the memory (for example, IEEE Journal of Solid-State Circuits vol. 29, No. 11, pp. 1366 to 1373, November 1994).

Thus, time required for the erase verify read in a case wherein k bits are connected to one data circuit becomes k times that in a case wherein one bit line is connected to one data circuit.

BRIEF SUMMARY OF THE INVENTION

An object of this invention is to provide a nonvolatile semiconductor memory device capable of solving the above described problems.

The above object can be attained by a nonvolatile semiconductor memory device comprising a memory cell array having first and second memory cell groups which are simultaneously selected during erasing or writing; a first bit line connected to the first memory cell group; a second bit line connected to the second memory cell group; a node connected to the first and second bit lines; and a data circuit where data inputs during erase or write verify read.

Further, the data circuit includes a latch circuit and the data circuit subjects first data read from the first memory cell group and second data read from the second memory cell group to a logical process, stores data indicating that the erasing or writing operation is completed in the latch circuit if both of the first and second data indicate that the erasing or writing of corresponding memory cells are completed, and stores data indicating that the erasing or writing operation is performed again in the latch circuit if at least one of the first and second data indicates that the erasing or writing of corresponding memory cell is insufficient.

A nonvolatile semiconductor memory device of this invention comprises a memory cell array having first and second memory cell groups which are simultaneously selected during erasing or writing; a first bit line connected to the first memory cell group; a second bit line connected to the second memory cell group; a node connected to the first and second bit lines; and a data circuit where data inputs during erase or write verify read.

Further, the data circuit includes a latch circuit and the data circuit stores first data read from the first memory cell group in the latch circuit during erase or write verify read for the first memory cell group, and then, sets a potential of the node based on the first data and a second data read from the second memory cell group during erase or write verify read for the second memory cell group.

A nonvolatile semiconductor memory device of this invention comprises a memory cell array having first and second memory cell groups which are simultaneously selected during erasing or writing; a bit line connected to the first and second memory cell groups; a node connected to the bit line; and a data circuit where data inputs erase or write verify read.

Further, the data circuit includes a latch circuit and the data circuit stores a first data read from the first memory cell group in the latch circuit during erase or write verify read for the first memory cell group, and then, sets a potential of the node based on the first data and a second data read from the second memory cell group during erase or write verify read for the second memory cell group.

A nonvolatile semiconductor memory device of this invention comprises a memory cell array having a plurality of memory cell groups which are simultaneously selected during erasing or writing; a bit line connected to the plurality of memory cell groups; a node connected to the bit line; and a data circuit where data inputs during erase or write verify read.

Further, the data circuit sets a potential of the node to a value indicating that the erasing or writing is completed when all read data of the memory cell groups indicate that the erasing or writing of corresponding memory cells are sufficient and sets a potential of the node to a value indicating that the erasing or writing is incompleted when at least one of the read data of the memory cell groups indicates that the erasing or writing of corresponding memory cell is insufficient.

A nonvolatile semiconductor memory device of this invention comprises a memory cell array having first and second memory cell groups which are simultaneously selected during erasing or writing; a first bit line connected to the first memory cell group; a second bit line connected to the second memory cell group; a node connected to the first and second bit lines; and a data circuit having a first latch circuit for storing first data read from the first memory cell group and a second latch circuit for storing second data read from the second memory cell group during erase or write verify read.

A nonvolatile semiconductor memory device of this invention comprises a memory cell array having first and second memory cell groups which are simultaneously selected during erasing or writing; a bit line connected to the first and second memory cell groups; a node connected to the bit line; and a data circuit having a first latch circuit for storing first data read from the first memory cell group and a second latch circuit for storing second data read from the second memory cell group during erase or write verify read.

A nonvolatile semiconductor memory device of this invention comprises a memory cell array having a plurality of memory cell groups which are simultaneously selected during erasing; a bit line connected to the plurality of memory cell groups; a node connected to the bit line; and a data circuit having a plurality of latch circuits for storing data read from the plurality of memory cell groups during erase or write verify read.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out hereinafter.

BRIEF DESCRIPTION OF THE SEVERAL VIEWS OF THE DRAWING

The accompanying drawings, which are incorporated in and constitute a part of the specification, illustrate presently preferred embodiments of the invention, and together with the general description given above and the detailed description of the preferred embodiments give below, serve to explain the principles of the invention.

FIG. 1 is a view showing a NAND cell line and select transistors;

FIG. 4 is a diagram showing an equivalent circuit of the device of FIG. 1;

DETAILED DESCRIPTION OF THE INVENTION

Embodiment 1

Figure 6:
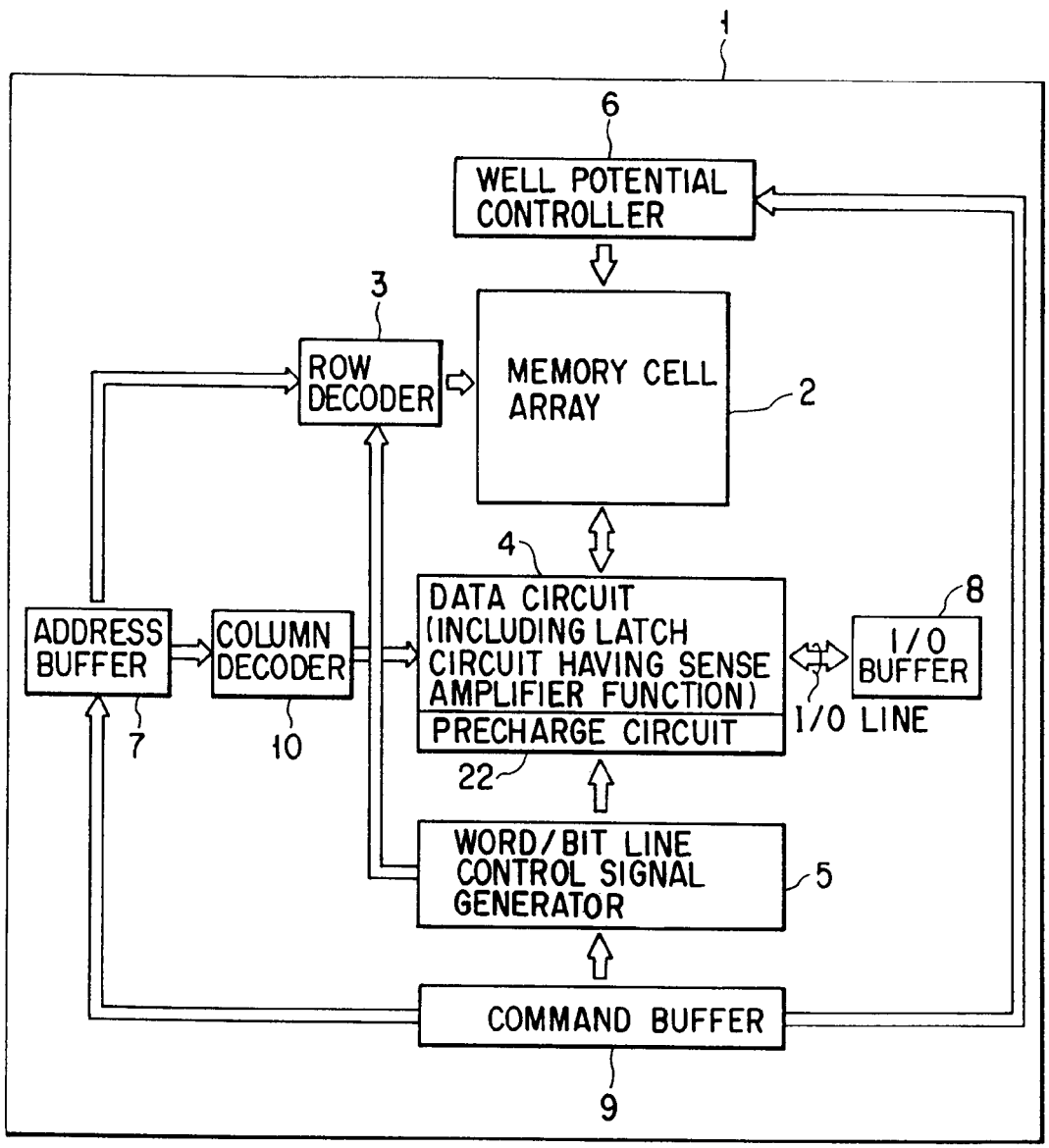
FIG. 6 is a diagram showing a nonvolatile semiconductor device of this invention.

FIG. 6 is a block diagram showing one example of a nonvolatile semiconductor memory device of this invention.

The nonvolatile semiconductor memory device 1 includes a memory cell array 2 having memory cells selected by word lines and bit lines and arranged in a matrix form, a row decoder 3 for selecting a word line and applying a preset voltage to the selected word line, a data circuit (including a latch circuit having a sense amplifier function) 4 for sensing a bit line voltage corresponding to data when data is read from a memory cell and outputting a voltage corresponding to a write voltage to the bit line when the write data is written into a memory cell, a word/bit line control signal generator 5 for supplying control signals to the word line and bit line, a precharge circuit 22 for supplying a voltage which does not change the data of the memory cell to bit lines which are not connected to the latch circuit in the data circuit 4 when data is written into the memory cell, an I/O buffer 8 for transferring input data written into the memory cell and output data read from the memory cell between the internal portion of the semiconductor memory device 1 and the exterior, a column decoder 10 for selecting one of the latch circuits in the data circuit 4 and connecting the selected latch circuit to an I/O line, a command buffer 9 for generating a command such as a write/read command, and an address buffer 7 for generating a column address and row address in response to an input address or input test command.

In the semiconductor memory device in which a preset potential is required to be applied to the well of the memory cell according to the operation mode, a well potential controller 6 is further provided.

Figure 7:
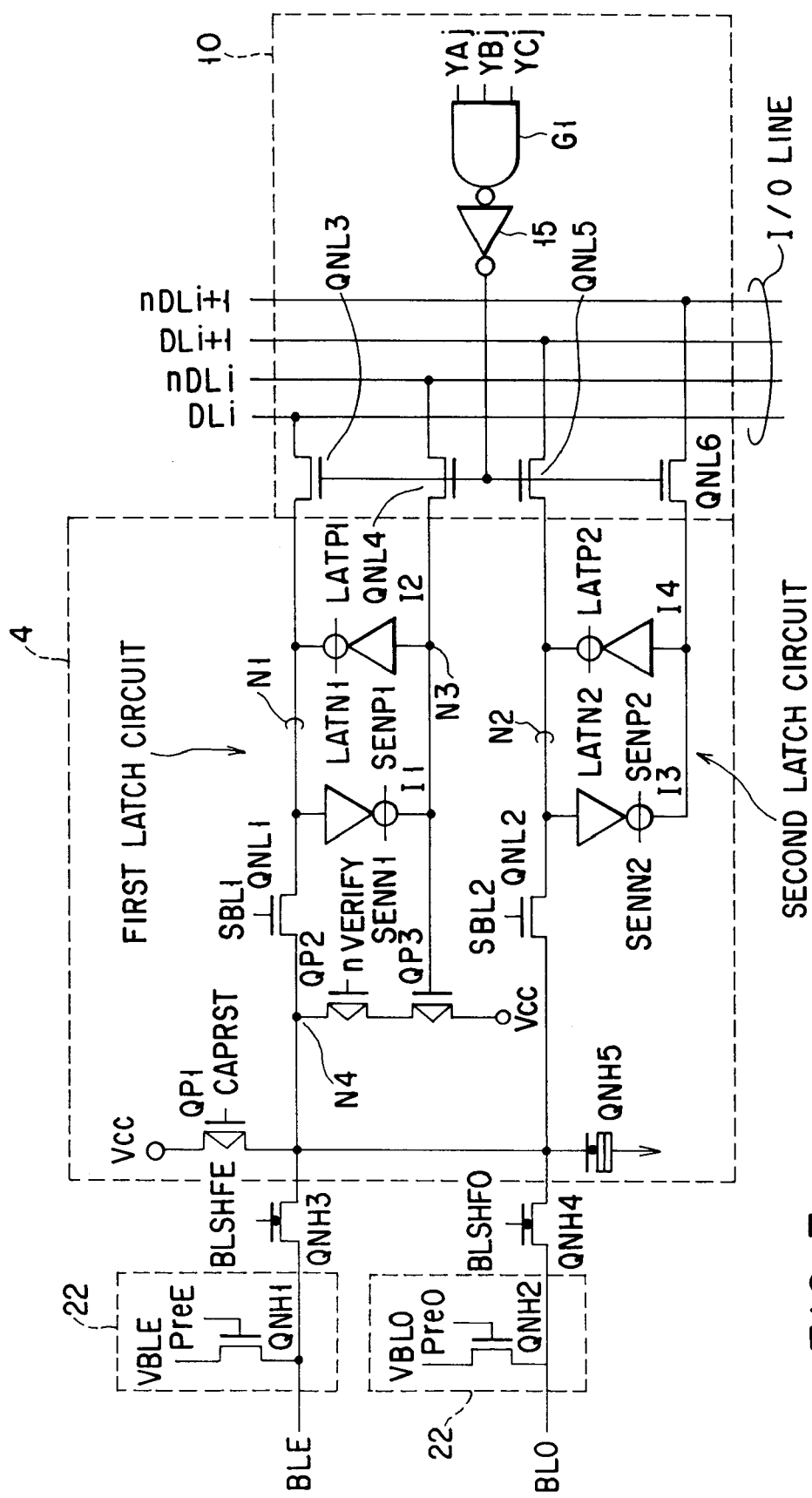
FIG. 7 is a diagram showing a latch circuit having a sense amplifier function.

FIG. 7 shows the column decoder 10, data circuit 4, precharge circuit 22, and the connecting portion between the bit lines and the I/O (data) lines.

In this example, a 3-level NAND type flash EEPROM is explained.

Figure 8:
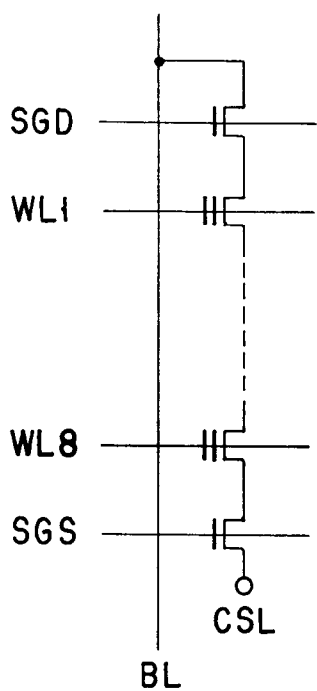
FIG. 8 is a diagram showing the construction of a NAND cell.
Figure 9:
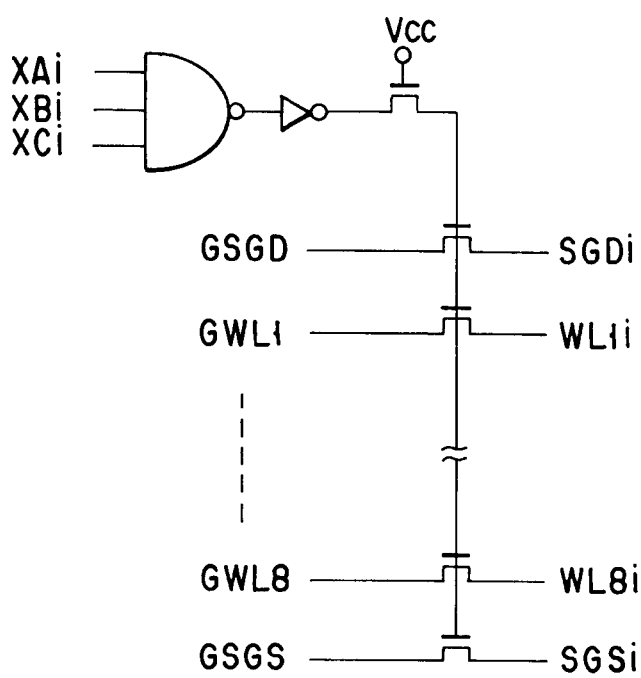
FIG. 9 is a diagram showing one example of the construction of a row decoder.
Figure 10:
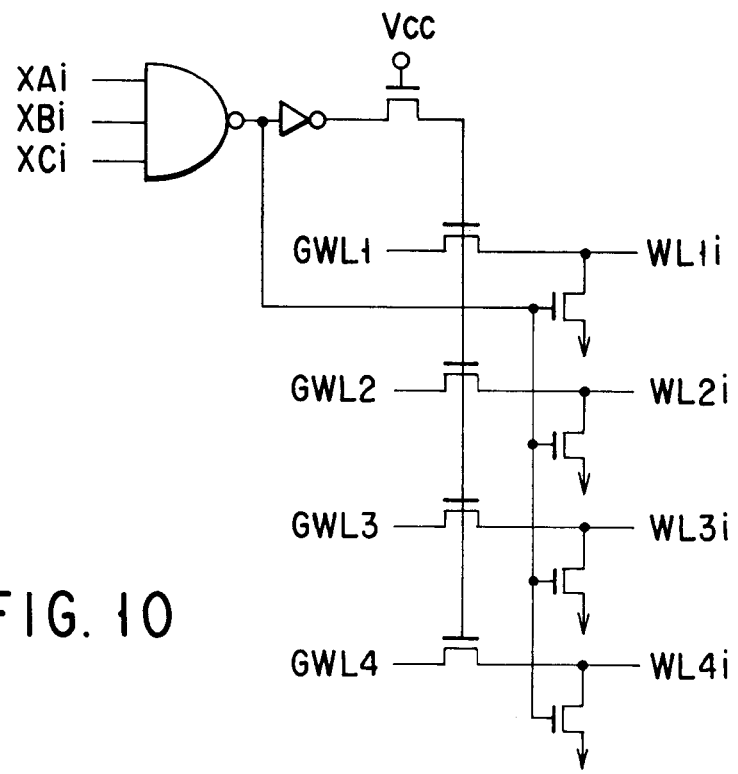
FIG. 10 is a diagram showing another example of the construction of a row decoder.

FIG. 8 shows the construction of a memory cell portion of the NAND type flash memory. FIGS. 21 to 24 show memory cell portions of memories other than the NAND type flash memory. FIGS. 9 and 10 show the construction of the row decoder.

In the 3-level NAND type flash EEPROM, for example, the data circuit 4 includes two latch circuits each having a sense amplifier function. The first latch circuit includes inverters I1, I2 and the second latch circuit includes inverters I3, I4.

The precharge circuit 22 is provided in correspondence to the bit line and one precharge circuit 22 is provided for one bit line. The first and second latch circuits are connected to a bit line BLE via a switch QNH3 and connected to a bit line BLO via a switch QNH4, respectively.

Further, the first latch circuit is connected to I/O lines DLi, nDLi via switches QNL3, QNL4 in the column decoder 10, and the second latch circuit is connected to I/O lines DLi+1, nDLi+1 via switches QNL5, QNL6 in the column decoder 10.

The relation between the 3-level data "0", "1", "2" and the threshold values and the relation between the 3-level data and latch data N1, N2 in the first and second latch circuits are as shown in the table 1.

TABLE 1

| 3-level data | Threshold voltage Vth | read | | write | |
|---|---|---|---|---|---|
| | | N1 | N2 | N1 | N2 |
| "0" | 0 V or less | L | L | H | H |
| "1" | $1\ V \leq Vth \leq 1.5\ V$ | H | L | L | H |
| "2" | $2\ V \leq Vth \leq 2.5\ V$ | H | H | L | L |

Figure 11:
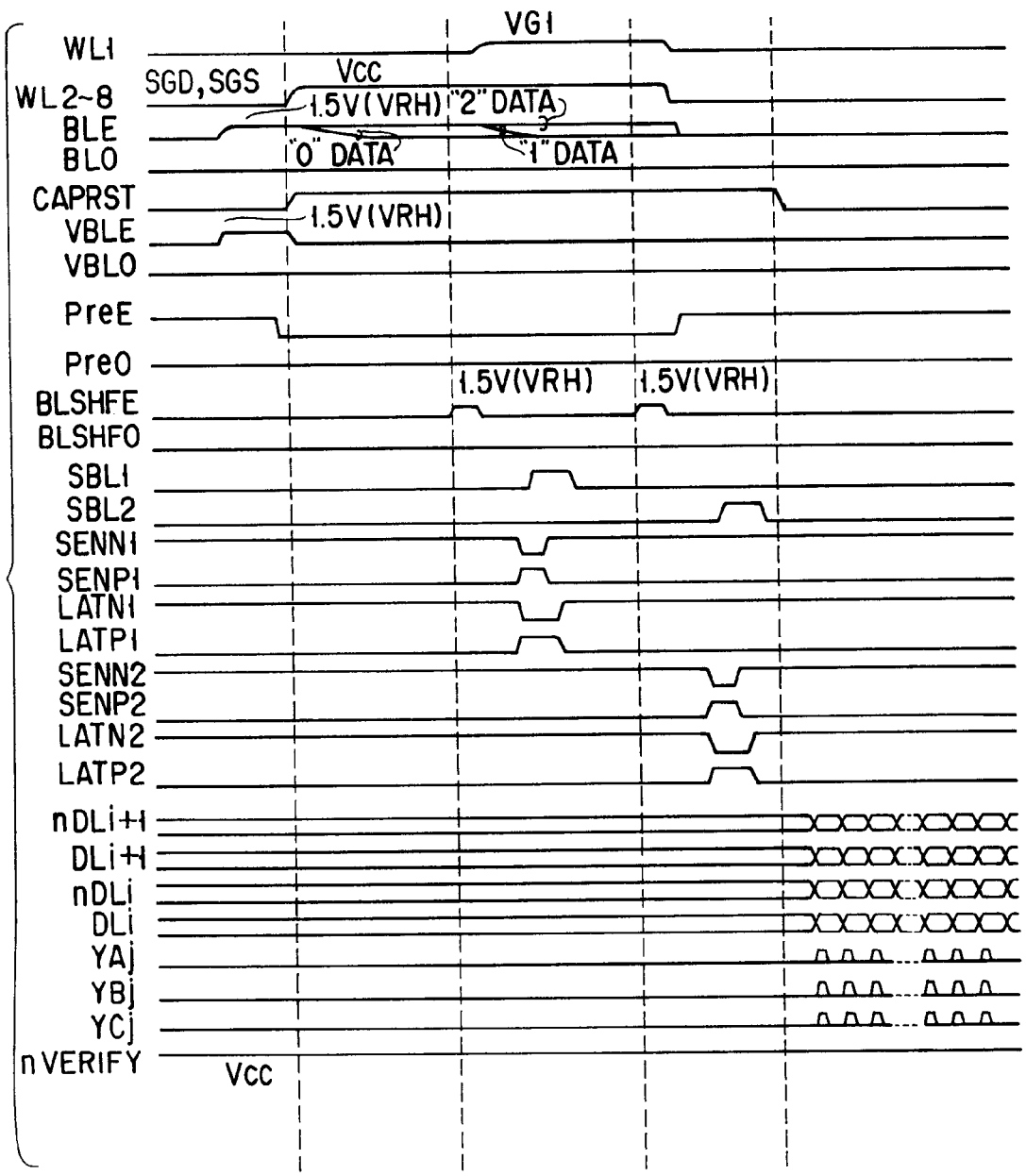
FIG. 11 is a waveform diagram for illustrating the data read operation.
Figure 12:
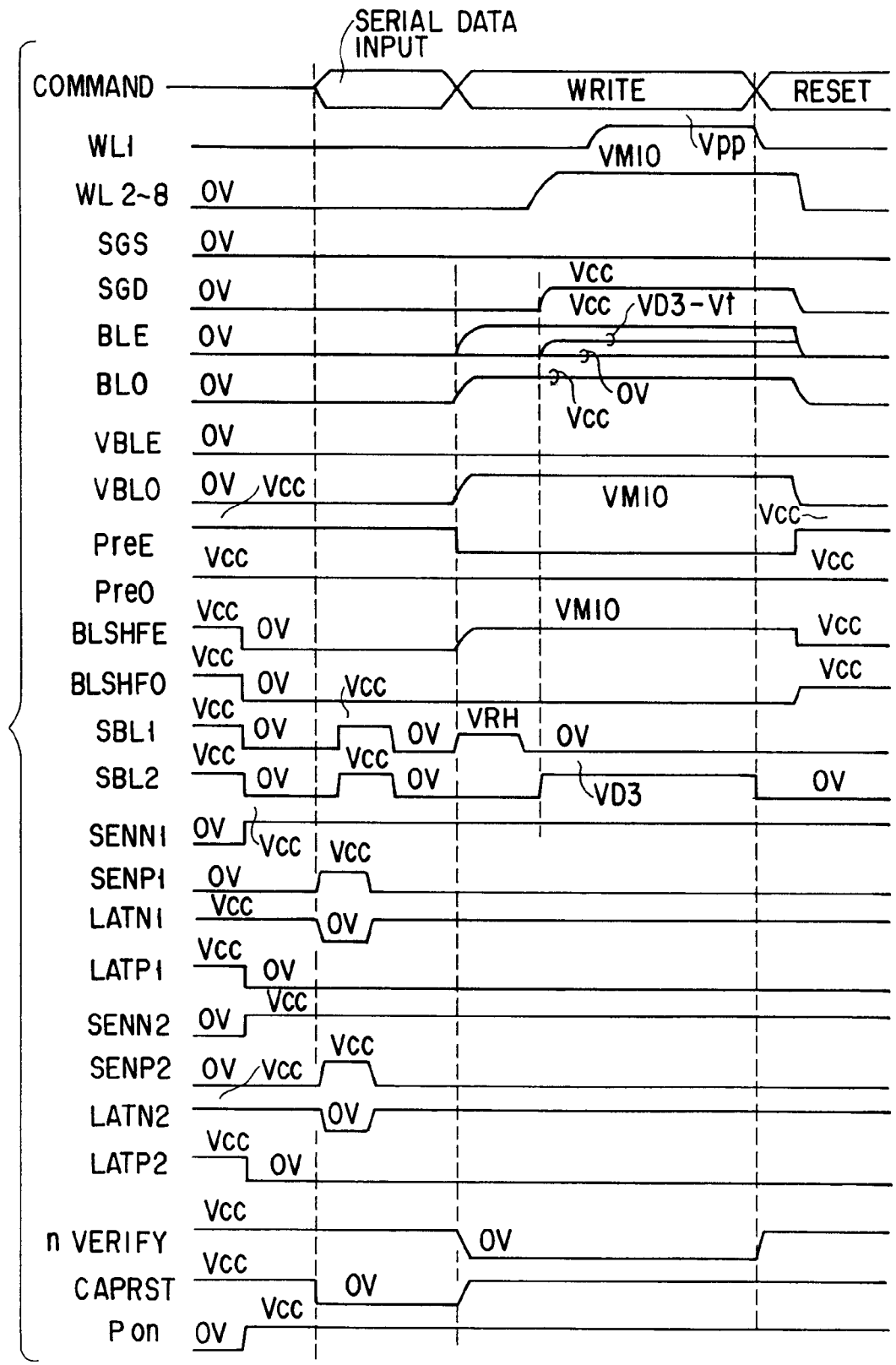
FIG. 12 is a waveform diagram for illustrating the data write operation.
Figure 13:
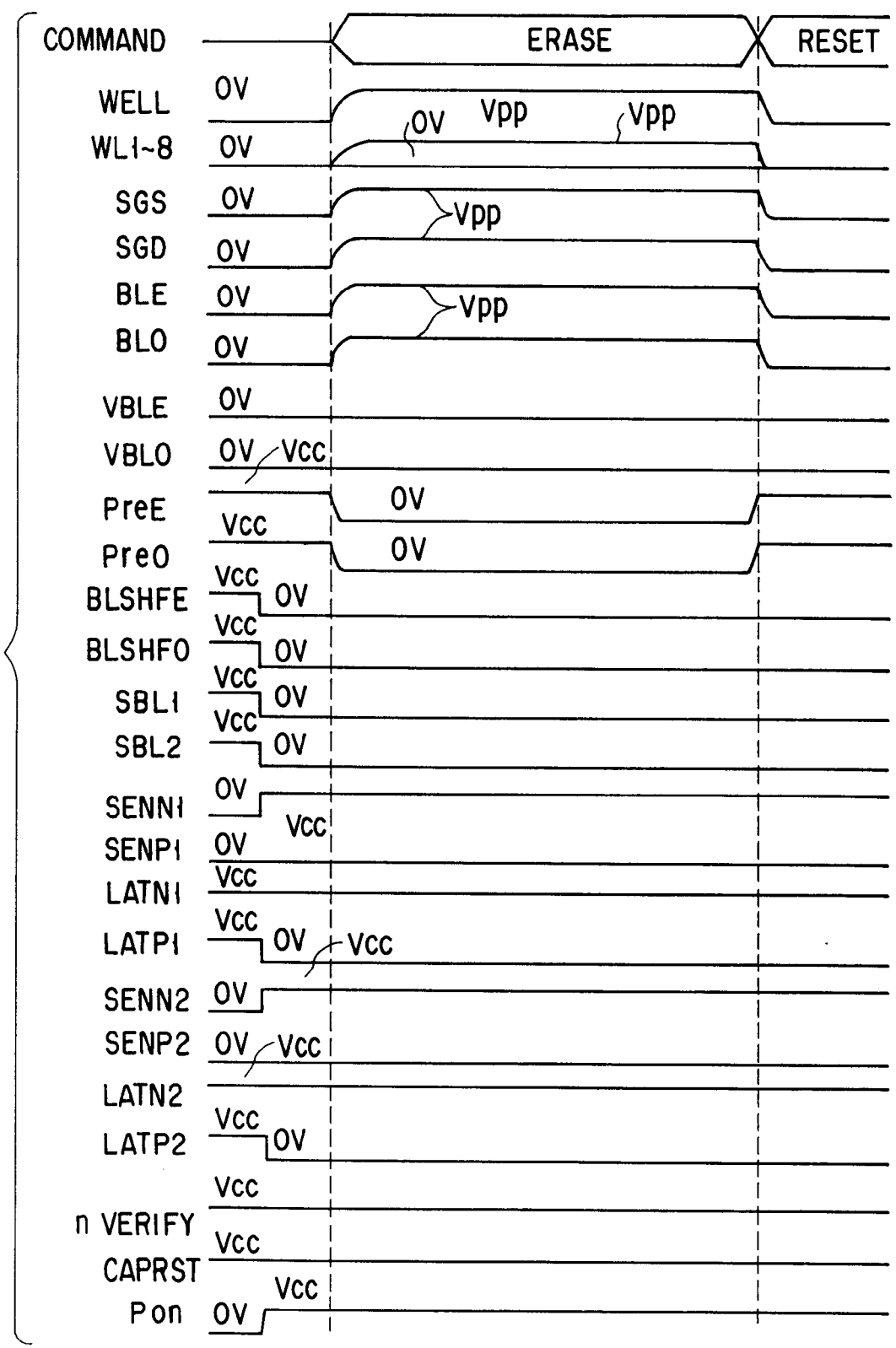
FIG. 13 is a waveform diagram for illustrating the data erase operation.

FIG. 11 is a waveform diagram for illustrating the data read operation, FIG. 12 is a waveform diagram for illustrating the data write operation, and FIG. 13 is a waveform diagram for illustrating the data erase operation.

In this example, the bit line BLE is selected and the bit line BLO is non-selected in the read and write operations.

First, the read operation is explained.

The selected bit line BLE is charged to 1.5 V and is set into the electrically floating state. Then, non-selected word lines WL2 to WL8 and select gates SGS, SGD are set to the power supply voltage VCC. The selected word line WL1 is set at 0 V. If data of the selected memory cell is "0", the potential of the bit line BLE is discharged to 0 V and if data of the selected memory cell is "1" or "2", the potential of the bit line BLE is kept unchanged at 1.5 V.

The potential of the bit line BLE is read into the first latch circuit by a signal SBL1. Therefore, the node N1 becomes "L" if data is "0" and it becomes "H" if data is "1" or "2". The potential of the selected word line WL1 is set to VG1 (=1.8 V).

If data of the selected memory cell is "1", the potential of the bit line BLE is discharged to 0 V, and if data of the selected memory cell is "2", the potential of the bit line BLE is kept unchanged at 1.5 V. If data of the selected memory cell is "0", the potential of the bit line BLE is already discharged to 0 V.

The potential of the bit line BLE is read into the second latch circuit by a signal SBL2. Therefore, the node N2 becomes "L" if data is "0" or "1" and it becomes "H" if data is "2" (refer to the table 1).

Data items latched in the first and second latch circuits are serially read to the I/O line for each data circuit.

Next, the write operation is explained.

If a voltage which is sufficiently high to permit the chip to effect the normal operation is reached at the time of turn-ON of the power supply, a power-ON signal Pon is set to "H" and latch data N1, N2 of the first and second latch circuits are both set to "L". After this, if a command for inputting write data is input, the latch data items N1, N2 of the first and second latch circuits are both inverted and set to "H".

The selected bit line BLE is applied with VCC, VD3−Vt (=1 V) or 0 V according to write data "0", "1" or "2". The non-selected bit line BLO is applied with the voltage VCC for keeping data unchanged. The select gate SDG is set to VCC, the select gate SGS is set to 0 V, the selected word line WL1 is set to VPP (=20 V), and the non-selected word lines WL2 to WL8 are set to VM10 (=10 V).

In this case, among the potentials output from the data circuit 4 to the bit line BLE, 0 V is the write potential and VCC is the non-write potential.

In the selected memory cell in which the bit line is applied with 0 V or 1 V, since the voltage between the gate and the channel is high, a tunnel current flows to raise the threshold voltage of the memory cell. When the bit line is 0 V, a larger tunnel current flows in comparison with a case wherein the bit line is applied with 1 V. Therefore, the threshold voltage set when the bit line is 0 V becomes higher than the threshold voltage set when the bit line is 1 V. In the selected memory cell in which the bit line is applied with VCC, since the voltage between the gate and the channel is low, no tunnel current flows to keep data "0".

Finally, the erase operation is explained.

If an erase command is input, VPP (=20 V) is applied to the well of the memory cell array. The gate of the selected memory cell is applied with 0 V. The tunnel current flows in a direction opposite to that in the write time and the threshold voltage of the memory cell is lowered. On the other hand, since the gate of the selected transistor and the non-selected memory cell are set into the electrically floating state, they rise to approx. VPP together with the well of the memory cell array. Therefore, no tunnel current flows and the threshold voltage is kept unchanged.

<Erase Verify Read>

Figure 14:
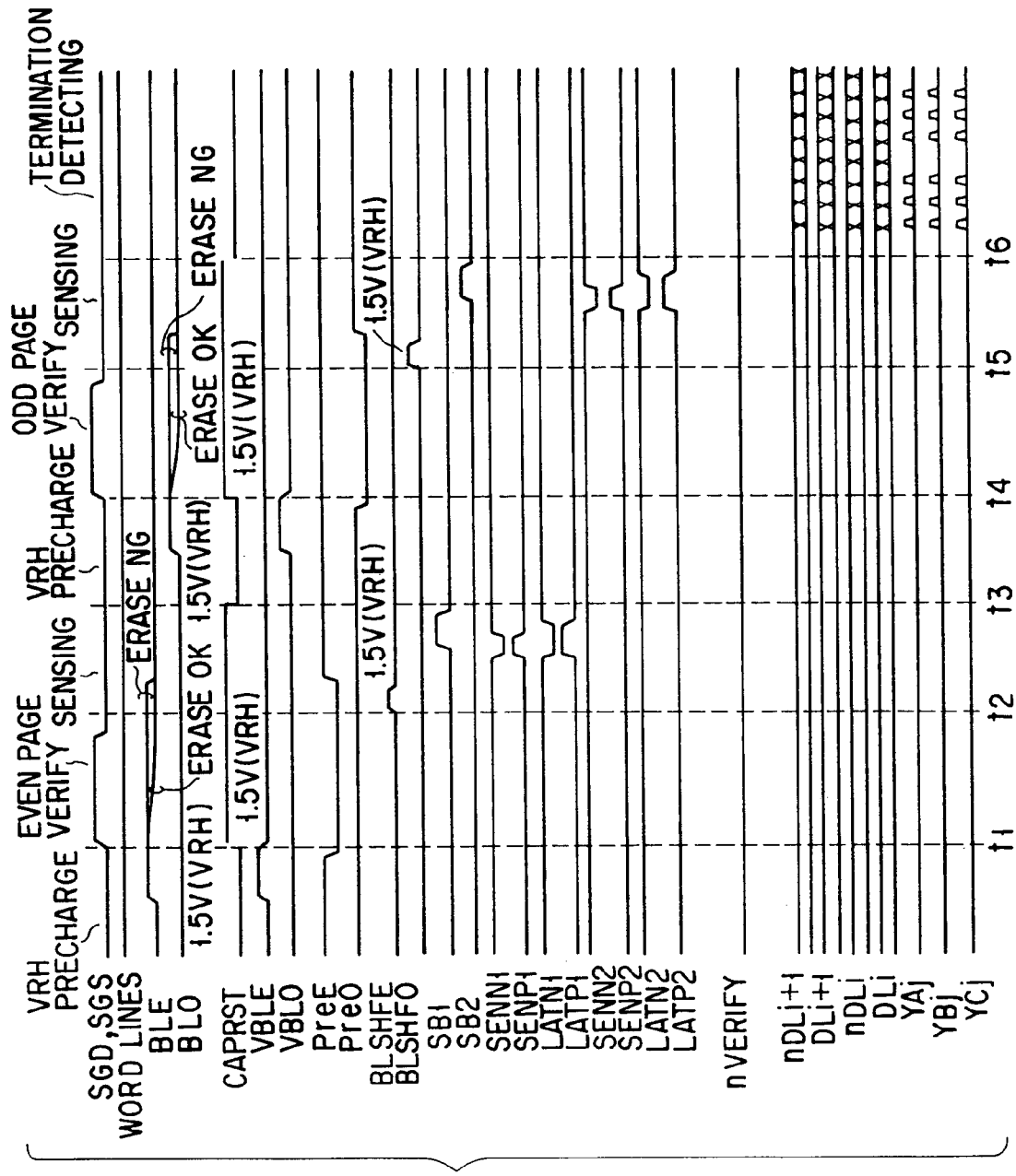
FIG. 14 is a waveform diagram for illustrating the erase verify read operation.
Figure 15A:
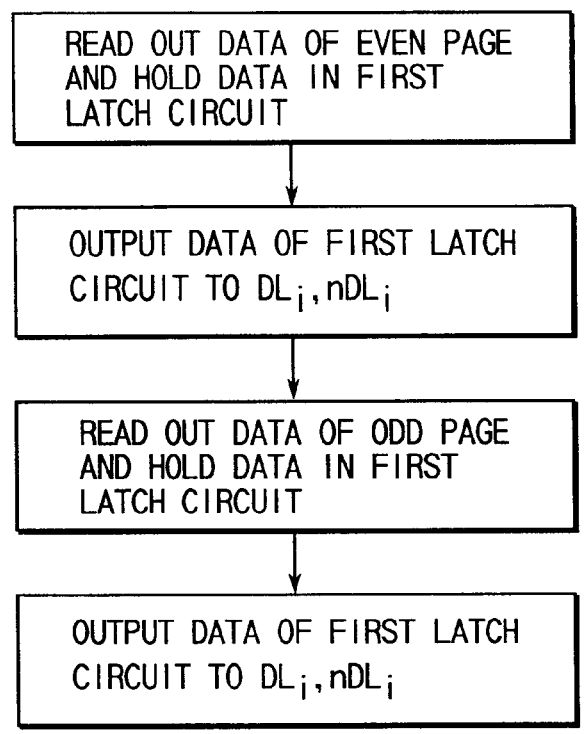
FIGS. 15A and 15B are flowcharts for illustrating the erase verify read operation.
Figure 15B:
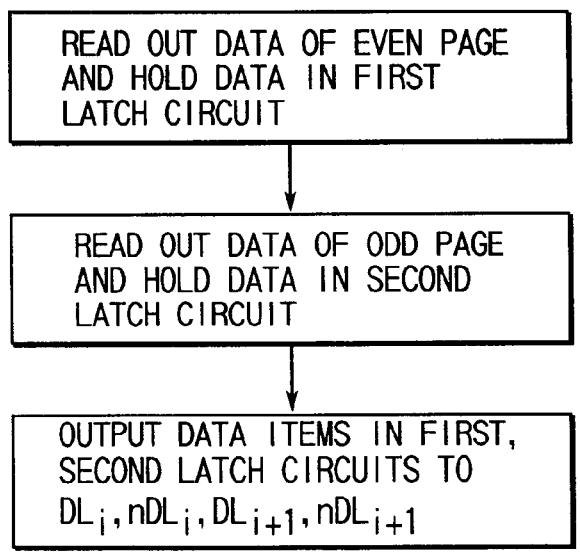

Next, the erase verify read operation is explained with reference to the timing diagram of FIG. 14 and the block diagram of FIGS. 15A and 15B.

When the erase operation is effected in the unit of block, the verify read operation is effected twice for even and odd pages for the memory cells (for example, memory cells selected by the word lines WL1 to WL8) in one block.

The erase verify read operation is first effected for the even page (for example, memory cells connected to the bit line BLE in FIG. 7) and read data is held in the first latch circuit. Next, the erase verify read operation is effected for the odd page (for example, memory cells connected to the bit line BLO in FIG. 7) and read data is held in the second latch circuit.

If the select gates SGS, SGD are set to Vcc and the word lines WL1 to WL8 are set to 0 V at the time t1 after the bit line BLE is precharged to 1.5 V, the bit line is set to 0 V when the erase state of the memory cell is sufficient (OK) and it is kept at 1.5 V when the erase state of the memory cell is insufficient (NG).

At the time t2, the signal BLSHFE is set to 1.5 V, the bit line potential is transferred into the data circuit, and then, the signal SBL1 is set to "H" so that data will be transferred to the node N1 and sensed. Thus, data of the even page is held in the first latch circuit. During the operation of reading out data of the even page, the bit line BLO is kept at 0 V in order to reduce the capacitive coupling noise between the bit lines.

Next, the erase verify read operation is effected for the odd page (for example, memory cells connected to the bit line BLO in FIG. 7). If the select gate lines SGS, SGD are set to Vcc and the word lines WL1 to WL8 are set to 0 V at the time t4 after the bit line BLO is precharged to 1.5 V, the bit line is set to 0 V when the erase state of the memory cell is sufficient (OK), and it is kept at 1.5 V when the erase state of the memory cell is insufficient (NG). At the time t5, the signal BLSHFO is set to 1.5 V, the bit line potential is transferred into the data circuit, and then, the signal SBL2 is set to "H" so that data will be transferred to the node N2 and sensed.

Thus, data of the odd page is held in the second latch circuit. During the operation of reading out data of the odd page, the bit line BLE is kept at 0 V in order to reduce the capacitive coupling noise between the bit lines.

Read data items of the even and odd pages are respectively held in the first and second latch circuits. Then, by sequentially selecting the columns by use of the column decoder, data items in the first and second latch circuits are output almost simultaneously. As a result, whether or not the erase operation is sufficiently effected can be determined.

As is clearly understood from FIG. 15, in the conventional case, the verify read is effected only by use of the first latch circuit, but in this embodiment, since both of the first and second latch circuits are used, the operation speed of the verify read can be enhanced.

In the above embodiment, it is possible to first read data from the memory cells of the even page and hold the data in the first latch circuit and then output read data held in the first latch circuit to the I/O lines DLi, nDLi during the read of data from the memory cells of the odd page.

Likewise, after the verify read operation is effected twice for the memory cells of the first and second blocks which are almost simultaneously subjected to the erase operation, read data may be held in the first and second latch circuits.

Further, if the data circuit includes first to n-th latch circuits, it is of course possible to hold read data items in the first to n-th latch circuits.

Figure 16:
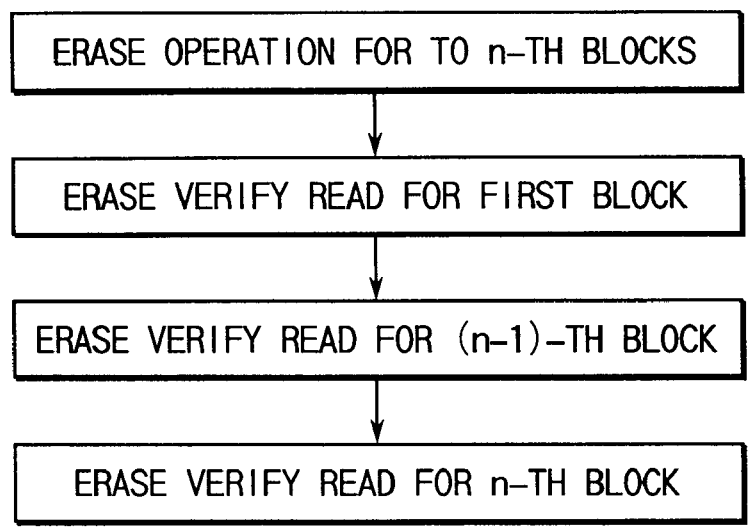
FIG. 16 is a flowchart for illustrating the erase verify read operation.

That is, first, the first to n-th (n is a natural number equal to or larger than 2) blocks are almost simultaneously subjected to the erase operation, and then the verify read for each block unit described above is effected for each of the blocks which have been subjected to the erase operation. Thus, if a plurality of blocks are substantially simultaneously subjected to the erase operation, the erase operation may be effected as shown in FIG. 16.

Figure 2:
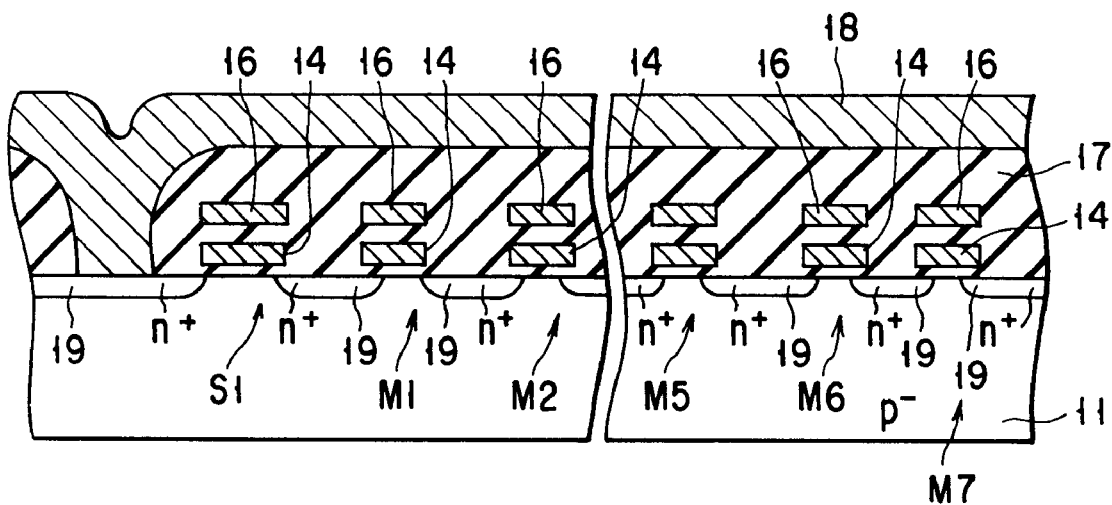
FIG. 2 is a cross sectional view taken along the line II—II of FIG. 1.
Figure 3:
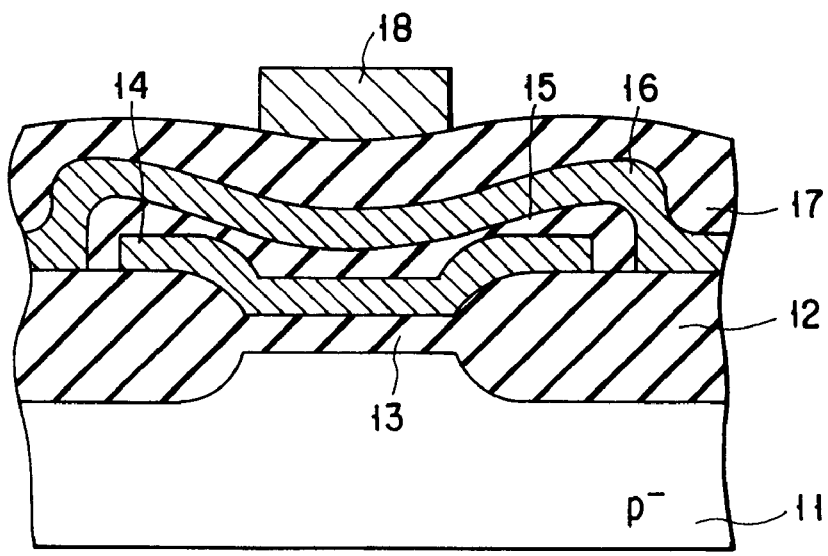
FIG. 3 is a cross sectional view taken along the line III—III of FIG. 1.
Figure 5:
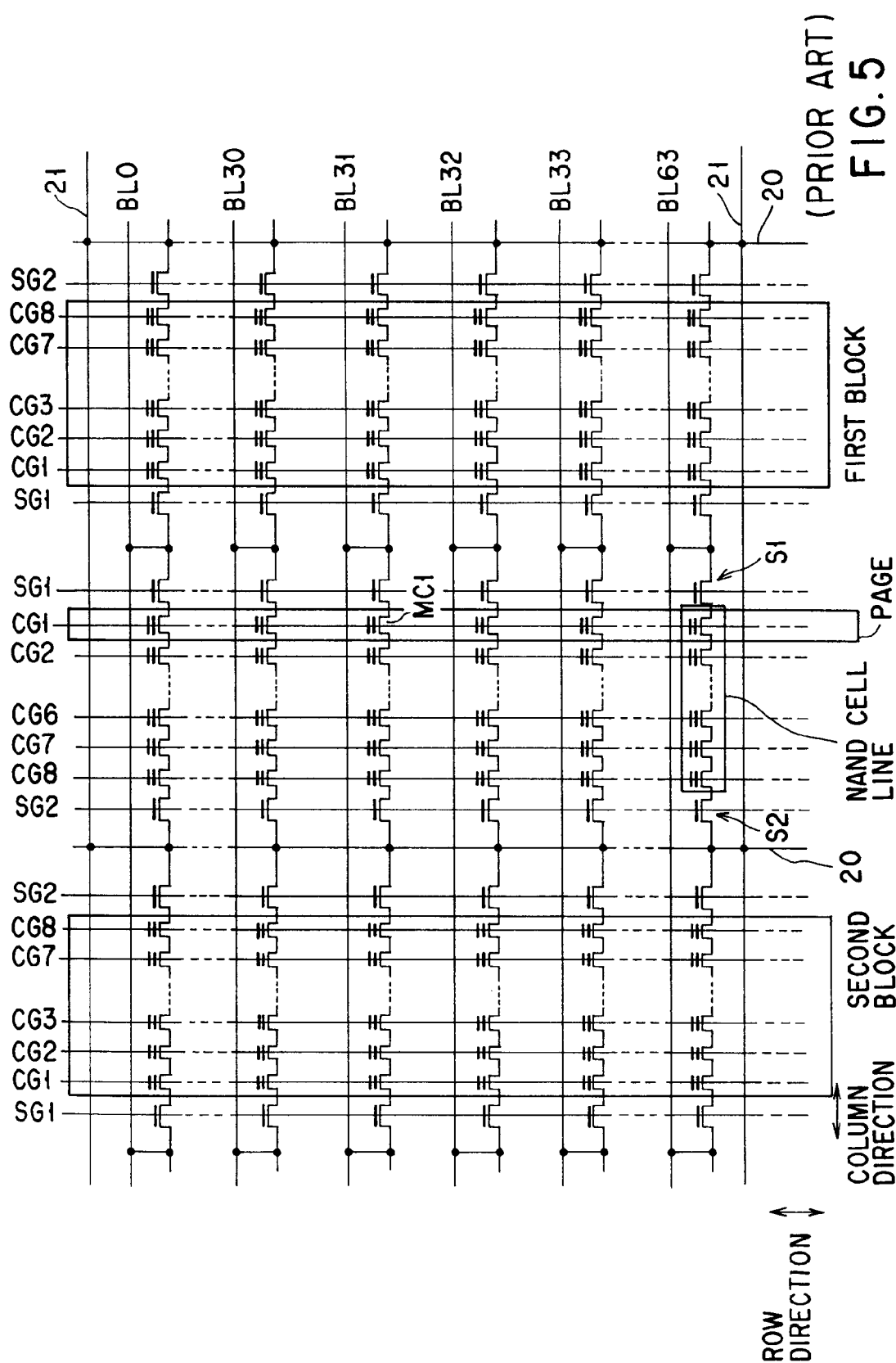
FIG. 5 is a diagram showing an equivalent circuit of the NAND type EEPROM memory cell array.

This invention is also effective when one data circuit is provided for each bit line in the cell array as shown in FIG. 5. As the data circuit, a data circuit having two latch circuits as shown in FIG. 7 is considered.

When the first and second blocks of FIG. 5 are simultaneously subjected to the erase operation, first, the verify read for the first block is effected and read data is held in the first latch circuit. Next, the verify read for the second block is effected and read data is held in the second latch circuit. After this, data items of the first and second blocks held in the first and second latch circuits are almost simultaneously output from the first and second latch circuits by sequentially selecting the columns by use of the column decoder. As a result, whether or not the erase operation is sufficiently effected can be determined.

In the conventional case, the verify read is effected only by use of the first latch circuit, but in this embodiment, since both of the first and second latch circuits are used, the operation speed of the verify read can be enhanced even in the memory cell array as shown in FIG. 5.

Figure 30:
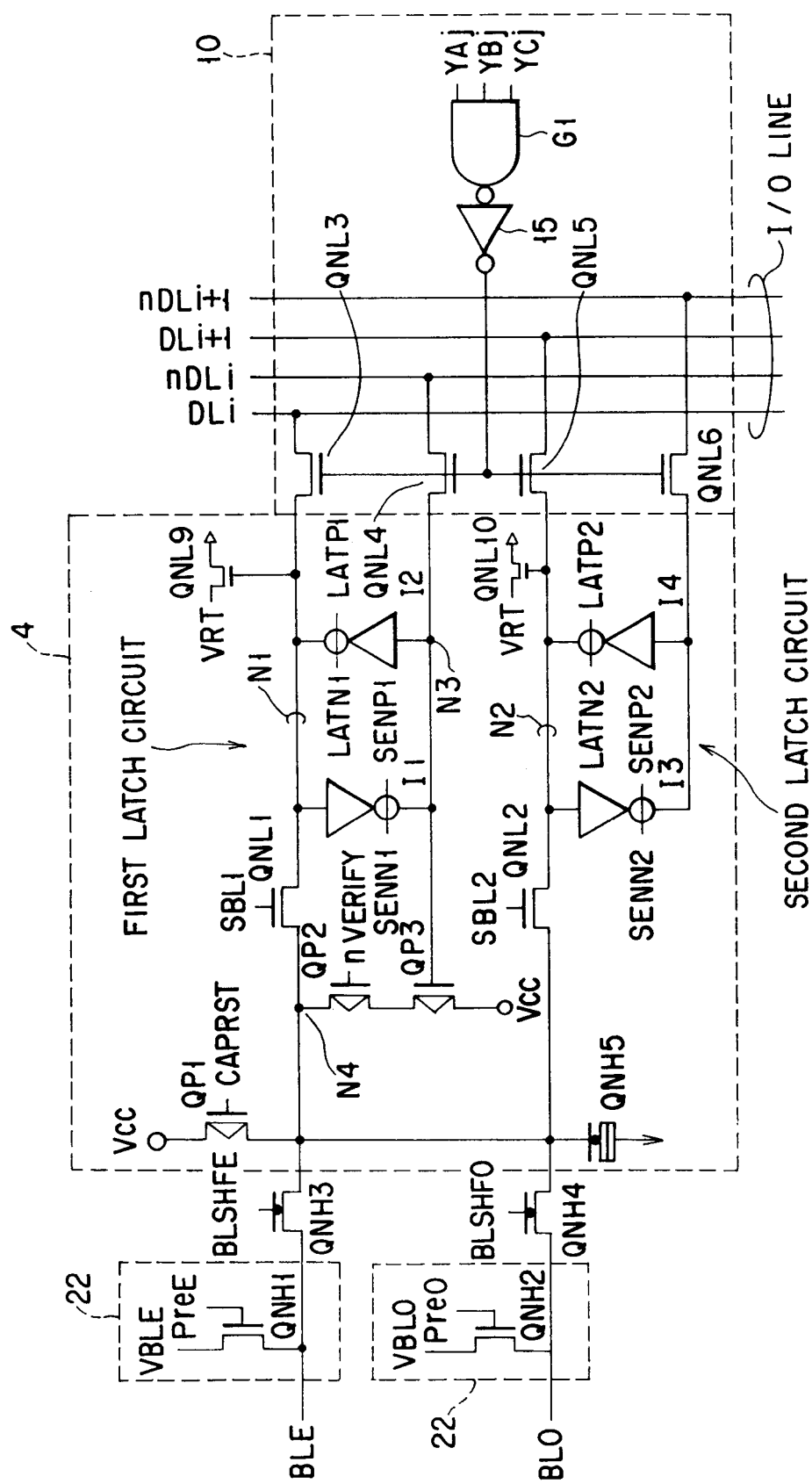
FIG. 30 is a diagram showing a latch circuit having a sense amplifier function.

The end of the erase operation can be detected by outputting data of the first to n-th latch circuits to the I/O line or may be simultaneously detected by use of erase end simultaneous detection transistors QNL9, QNL10, . . . as shown in FIG. 30, for example.

As described above, after data items of the even and odd pages are read to the first and second latch circuits, or data items of the first to n-th blocks are read to the first to n-th latch circuits, VRT is precharged to Vcc, for example. In the column including a memory cell whose erase state is insufficient, at least one of the nodes N1, N2, . . . is set to "H", at least one of the n-channel MOS transistors QNL9, QNL10, . . . is turned ON, and VRT is lowered from the precharged voltage.

Only if all of the selected memory cells are set into the sufficiently erased state, the nodes N1, N2 in all of the columns are set to "L". As a result, since the n-channel MOS transistors QNL9, QNL10, . . . in all of the data circuits are turned OFF, VRT holds the precharge potential and the end of the erase operation is detected.

Embodiment 2

Figure 17:
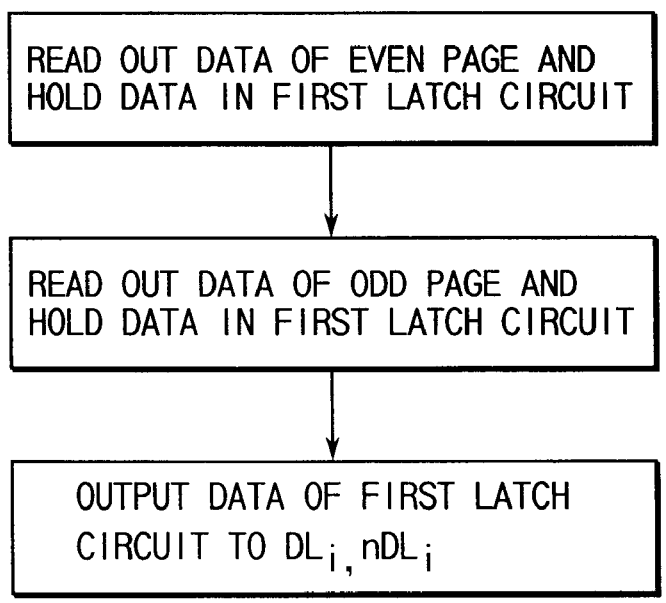
FIG. 17 is a flowchart for illustrating the erase verify read operation.
Figure 18:
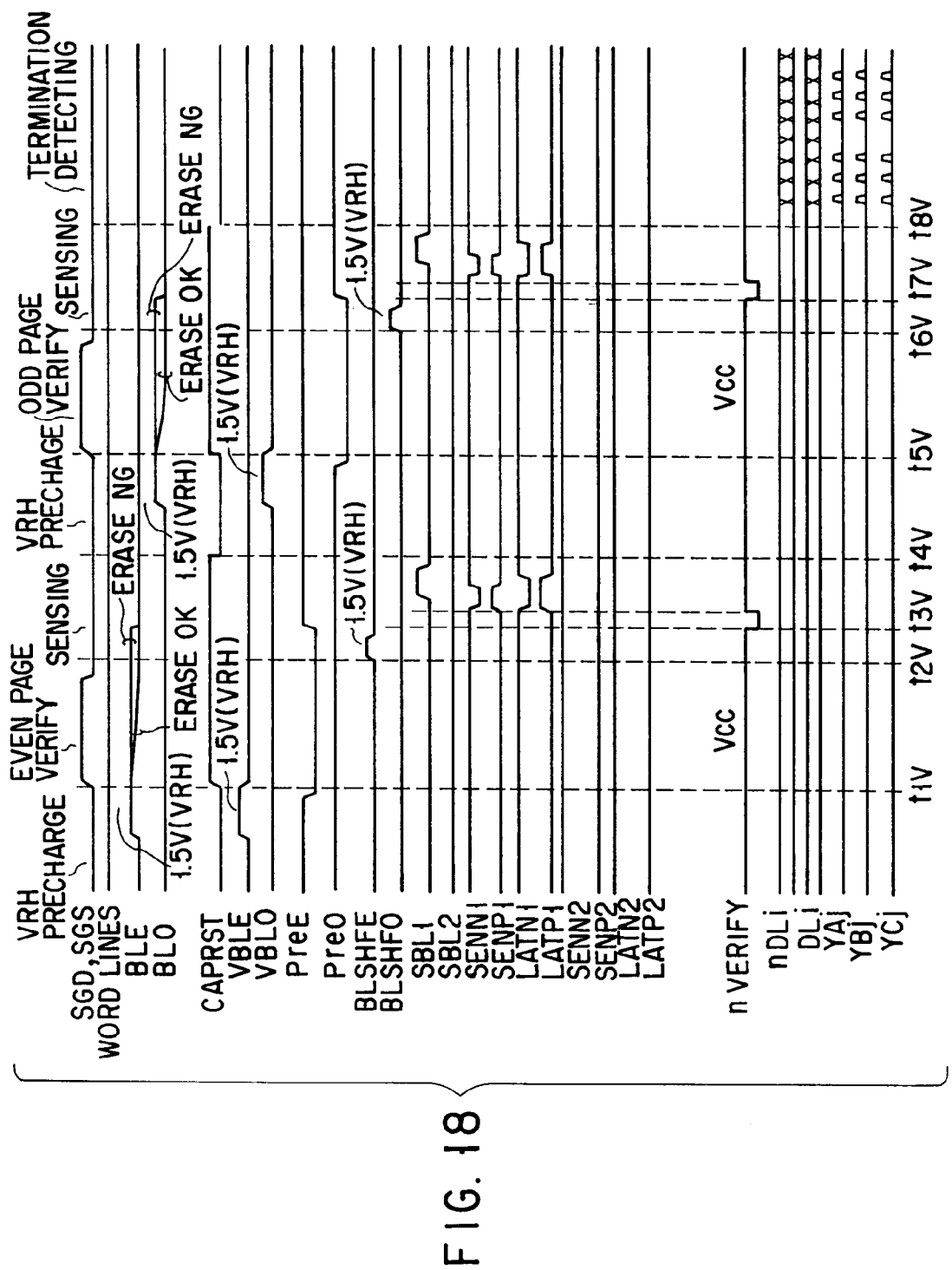
FIG. 18 is a waveform diagram for illustrating the erase verify read operation.

(1) In the case of one block erase:

FIG. 17 is a schematic diagram for illustrating the operation of the erase verify read for one block and FIG. 18 is a timing diagram.

The verify read is effected for the even page (for example, memory cells connected to the bit line BLE in FIG. 7) and read data is held in the first latch circuit. Then, the verify read is effected for the odd page (for example, memory cells connected to the bit line BL0 in FIG. 7) and read data is held in the first latch circuit.

Prior to the verify read, the node N1 is set to "L" and the node N3 is set to "H". If the bit line BLE is precharged to 1.5 V, and then, the select gates SGS, SGD are set to Vcc and the word lines WL1 to WL8 are set to 0 V at the time t1v, the bit line is set to 0 V when the erase state of the memory cell is sufficient (OK) and it is kept at 1.5 V when the erase state of the memory cell is insufficient (NG).

The signal BLSHFE is set to 1.5 V at the time t2v and the potential of the bit line is transferred into the data circuit. After this, the signal nVERIFY is set to "L" at the time t3v. Since the node N3 is set at "H", a p-channel transistor Qp3 is turned OFF so as to keep the potential of the node N4 unchanged.

In the erase verify read operation for one block, the operation for setting the signal nVERIFY to "L" at the time t3v and the operation for setting the first latch circuit (for setting the node N3 to "H") can be omitted.

Then, the signal SBL1 is set to "H" and data is transferred to the node N1 and sensed. Thus, data of the even page is held in the first latch circuit. During the operation of reading out data of the even page, the bit line BL0 is kept at 0 V in order to reduce the capacitive coupling noise between the bit lines. As the result of verify read described above, the node N1 is set to "H" in the case of insufficient erase (NG) and the node N1 is set to "L" in the case of sufficient erase (OK).

Next, the verify read is effected for the odd page (for example, memory cells connected to the bit line BL0 in FIG. 7). If the bit line BL0 is precharged to 1.5 V, and then, the select gate lines SGS, SGD are set to Vcc and the word lines WL1 to WL8 are set to 0 V at the time t5v, the bit line is set to 0 V when the erase state of the memory cell is sufficient (OK) and it is kept at 1.5 V when the erase state of the memory cell is insufficient (NG). The signal BLSHFO is set to 1.5 V at the time t6v and the potential of the bit line is transferred into the data circuit. After this, the signal nVERIFY is set to "L" at the time t7v.

Since "H" is latched in the node N3 in the case of sufficient erase (OK) as the result of data read of the even page, the p-channel transistor Qp3 is turned OFF so as to keep the potential of the node N4 unchanged. That is, the node N4 is set to "H" when the erase state of the odd page is insufficient (NG) and the node N4 is set to "L" when the erase state of the odd page is sufficient (OK).

On the other hand, since "L" is latched in the node N3 in the case of insufficient erase (NG) as the result of data read of the even page, the p-channel transistor Qp3 is turned ON so that the potential of the node N4 will be kept at "H" irrespective of data of the odd page.

Then, when the signal SBL1 is set to "H", data is transferred to the node N1 and sensed. During the operation of reading out data of the odd page, the bit line BLE is kept at 0 V in order to reduce the capacitive coupling noise between the bit lines.

As the result of the verify read operation described above, the node N1 is set to "H" if the erase state of at least one of the memory cells is insufficient (NG) in the even and odd pages as shown in the table 2. The node N1 is set to "L" only if the erase states of all of the memory cells in the even and odd pages are sufficient (OK).

TABLE 2

|  | sufficient erase for odd page | insufficient erase for odd page |
|---|---|---|
| Sufficient erase for even page | "L" | "H" |
| insufficient erase for even page | "H" | "H" |

Potential of the node N1 after erase verify read:

Thus, by setting the signal nVERIFY to "L" at the time t7v, the erase verify read can be effected only by use of the first latch circuit.

After the read data in the even and odd pages are read to the first latch circuit, data in the first latch circuit is output by sequentially selecting columns by use of the column decoder. As a result, whether the erase operation is sufficiently effected or not can be determined.

(2) A case wherein a plurality of blocks are almost simultaneously subjected to the erase operation:

Next, the erase and verify read operations of a plurality of blocks are explained with reference to FIGS. 18 and 19.

First, first to n-th (n is a natural number equal to or larger than 2) blocks are almost simultaneously subjected to the erase operation. Then, the erase verify read is effected for each block. This is different from the first embodiment in that data read to the first latch circuit is not necessarily output each time the verify read for each block is effected, and data may be output only once after data items of the first to n-th blocks are read to the first latch circuit as shown in FIG. 19.

The erase verify read for the first block is substantially the same as the erase verify read for one block. Further, the timing diagram is similar to FIG. 18.

The timing is different from that shown in FIG. 18 in that read data of the first latch circuit is not output to DLi, nDLi after the erase verify read for the second block and read data of the first latch circuit is output to DLi, nDLi after the end of the erase verify read for the first to n-th blocks.

The verify read is first effected for the even page of the first block (for example, memory cells connected to the bit line BLE in FIG. 7) and read data is held in the first latch circuit. Next, the verify read is effected for the odd page (for example, memory cells connected to the bit line BL0 in FIG. 7) and read data is held in the first latch circuit.

Prior to the verify read, the node N1 is set to "L" and the node N3 is set to "H".

First, if the bit line BLE is precharged to 1.5 V, and then, the select gates SGS, SGD are set to Vcc and the word lines WL1 to WL8 are set to 0 V at the time t1v, the bit line is set to 0 V when the erase state of the memory cell is sufficient (OK) and it is kept at 1.5 V when the erase state of the memory cell is insufficient (NG). The signal BLSHFE is set to 1.5 V at the time t2v and the potential of the bit line is transferred into the data circuit. After this, the signal nVERIFY is set to "L" at the time t3v. Since the node N3 is set at "H", the p-channel transistor Qp3 is turned OFF so as to keep the potential of the node N4 unchanged.

In the erase verify read operation for one block, the operation for setting the signal nVERIFY to "L" at the time t3v and the operation for setting the first latch circuit (for setting the node N3 to "H") can be omitted.

Then, when the signal SBL1 is set to "H", data is transferred to the node N1 and sensed.

Thus, data of the even page of the first block is held in the first latch circuit. During the operation of reading out data of the even page, the bit line BLO is kept at 0 V in order to reduce the capacitive coupling noise between the bit lines.

As the result of verify read described above, the node N1 is set to "H" in the case of insufficient erase (NG) and the node N1 is set to "L" in the case of sufficient erase (OK).

Next, the verify read is effected for the odd page of the first block (for example, memory cells connected to the bit line BLO in FIG. 7). If the bit line BLO is precharged to 1.5 V, and then, the select gates SGS, SGD are set to Vcc and the word lines WL1 to WL8 are set to 0 V at the time t5v, the bit line is set to 0 V when the erase state of the memory cell is sufficient (OK) and it is kept at 1.5 V when the erase state of the memory cell is insufficient (NG). The signal BLSHFO is set to 1.5 V at the time t6v and the potential of the bit line is transferred into the data circuit. After this, the signal nVERIFY is set to "L" at the time t7v.

Since "H" is latched in the node N3 in the case of sufficient erase (OK) as the result of data read of the even page of the first page, the p-channel transistor Qp3 is turned OFF so as to keep the potential of the node N4 unchanged. That is, the node N4 is set to "H" when the erase state of the odd page is insufficient (NG) and the node N4 is set to "L" when the erase state of the odd page is sufficient (OK).

On the other hand, since "L" is latched in the node N3 in the case of insufficient erase (NG) as the result of data read of the even page, the p-channel transistor Qp3 is turned ON so that the potential of the node N4 will be kept at "H" irrespective of data of the odd page.

Then, when the signal SBL1 is set to "H", data is transferred to the node N1 and sensed. During the operation of reading out data of the odd page, the bit line BLE is kept at 0 V in order to reduce the capacitive coupling noise between the bit lines.

As the result of the verify read operation described above, the node N1 is set to "H" if the erase state of at least one of the memory cells is insufficient (NG) in the even and odd pages of the first block as shown in the table 2. The node N1 is set to "L" only if the erase states of all of the memory cells in the even and odd pages of the first block are sufficient (OK).

Next, the erase verify read is effected for the second block. The timing is similar to that shown in FIG. 18.

The timing is different from that shown in FIG. 18 in that read data of the first latch circuit is not output to DLi, nDLi after the erase verify read for the second block and read data of the first latch circuit is output to DLi, nDLi after the end of the erase verify read for the first to n-th blocks.

The verify read is first effected for the even page of the second block (for example, memory cells connected to the bit line BLE in FIG. 7) and read data is held in the first latch circuit. Next, the verify read is effected for the odd page of the second block (for example, memory cells connected to the bit line BLO in FIG. 7) and read data is held in the first latch circuit.

Unlike the case of the erase verify read for the first block, the first latch circuit is not set and the first latch circuit holds the result of the erase verify read of the first block. That is, the node N1 is set to "H" if the erase state of at least one of the memory cells in the even and odd pages is insufficient as the result of the erase verify read of the first block.

First, if the bit line BLE is precharged to 1.5 V, and then, the select gates SGS, SGD are set to Vcc and the word lines WL1 to WL8 are set to 0 V at the time t1v, the bit line is set to 0 V when the erase state of the memory cell is sufficient (OK) and it is kept at 1.5 V when the erase state of the memory cell is insufficient (NG). Then, the signal BLSHFE is set to 1.5 V at the time t2v and the potential of the bit line is transferred into the data circuit. After this, the signal nVERIFY is set to "L" at the time t3v.

Since the node N3 is set at "L" if the erase state of the memory cell in the block (in this example, the first block) subjected to the verify read prior to the verify read for the second block is insufficient (NG), the p-channel transistor Qp3 is turned ON and the potential of the node N4 is set to Vcc irrespective of the potential of the bit line.

On the other hand, since the node N3 is set at "H" if the erase states of all of the memory cells in the block (in this example, the first block) subjected to the verify read prior to the verify read for the second block is sufficient (OK), the p-channel transistor Qp3 is turned OFF and the potential of the node N4 is kept unchanged.

That is, the node N4 is set to "H" if the erase state of the even page of the second block is insufficient and the node N4 is set to "L" if the erase state is sufficient.

Then, when the signal SBL1 is set to "H", data is transferred to the node N1 and sensed.

Thus, data of the even page is held in the first latch circuit. During the operation of reading out data of the even page of the second block, the bit line BLO is kept at 0 V in order to reduce the capacitive coupling noise between the bit lines. As the result of the verify read operation described above, the node N1 is set to "H" if the erase state is insufficient and the node N1 is set to "L" if the erase state is sufficient.

Next, the verify read is effected for the odd page of the second block (for example, memory cells connected to the bit line BLO in FIG. 7). If the bit line BLO is precharged to 1.5 V, and then, the select gates SGS, SGD are set to Vcc and the word lines WL1 to WL8 are set to 0 V at the time t5v, the bit line is set to 0 V when the erase state of the memory cell is sufficient (OK) and it is kept at 1.5 V when the erase state of the memory cell is insufficient (NG). The signal BLSHFO is set to 1.5 V at the time t6v and the potential of the bit line is transferred into the data circuit. After this, the signal nVERIFY is set to "L" at the time t7v.

Since "H" is latched in the node N3 when the erase states of all of the memory cells are sufficient, the p-channel transistor Qp3 is turned OFF so as to keep the potential of the node N4 unchanged. That is, the node N4 is set to "H" when the erase state of the odd page of the second block is insufficient (NG) and the node N4 is set to "L" when the erase state of the odd page is sufficient (OK).

On the other hand, since "L" is latched in the node N3 if at least one of the memory cells whose erase state is insufficient is present at the time of the verify read prior to the above verify read operation, the p-channel transistor Qp3 is turned ON so that the potential of the node N4 will be kept at "H" irrespective of data of the odd page of the second block.

Then, when the signal SBL1 is set to "H", data is transferred to the node N1 and sensed. During the operation of reading out data of the odd page, the bit line BLE is kept at 0 V in order to reduce the capacitive coupling noise between the bit lines.

The erase verify read of the i-th block is effected in substantially the same manner as the erase verify read for the second block.

The node N1 is set to "H" when the erase state of at least one of the blocks is insufficient as the result of the first to n-th erase verify read operations. The node N1 is set to "L" only if the erase states of all of the memory cells are sufficient.

After this, data of the first latch circuit is output to the I/O lines DLi, nDLi by sequentially selecting the columns by use of the column decoder. As a result, whether or not the erase is sufficiently effected for all of the blocks which are almost simultaneously subjected to the erase operation can be determined.

Figure 20:
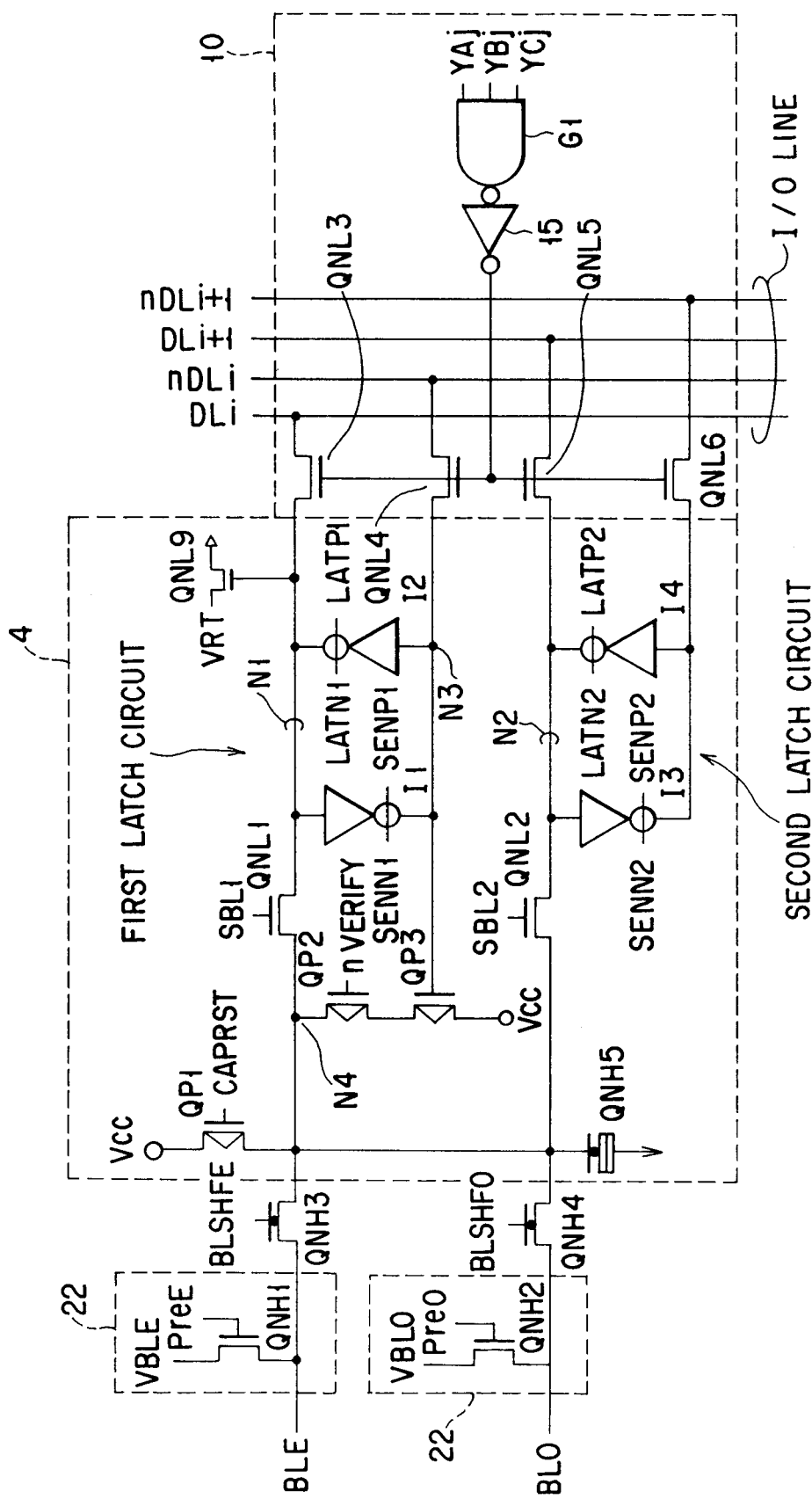
FIG. 20 is a diagram showing a latch circuit having a sense amplifier function.

The end of erase is detected by outputting data of the first latch circuit to DLi, nDLi as described above, but the end of erase may be simultaneously detected by use of the end-of-erase simultaneous detection transistor QNL9 shown in FIG. 20, for example.

As described above, after data items of the first to n-th blocks are read to the first latch circuit, the signal VRT is first precharged to Vcc, for example. In the column containing a memory cell whose erase state is insufficient, the node N1 is set to "H", the n-channel MOS transistor QNL9 is turned ON and the signal VRT is lowered from the precharged potential. The node N1 is set to "L" in all of the columns only if the erase states of all of the selected memory cells are sufficient. As the result, since the n-channel MOS transistor QNL9 in each of the data circuits is turned OFF, the signal VRT is kept at the precharge potential and the end of erase is detected.

Figure 19:
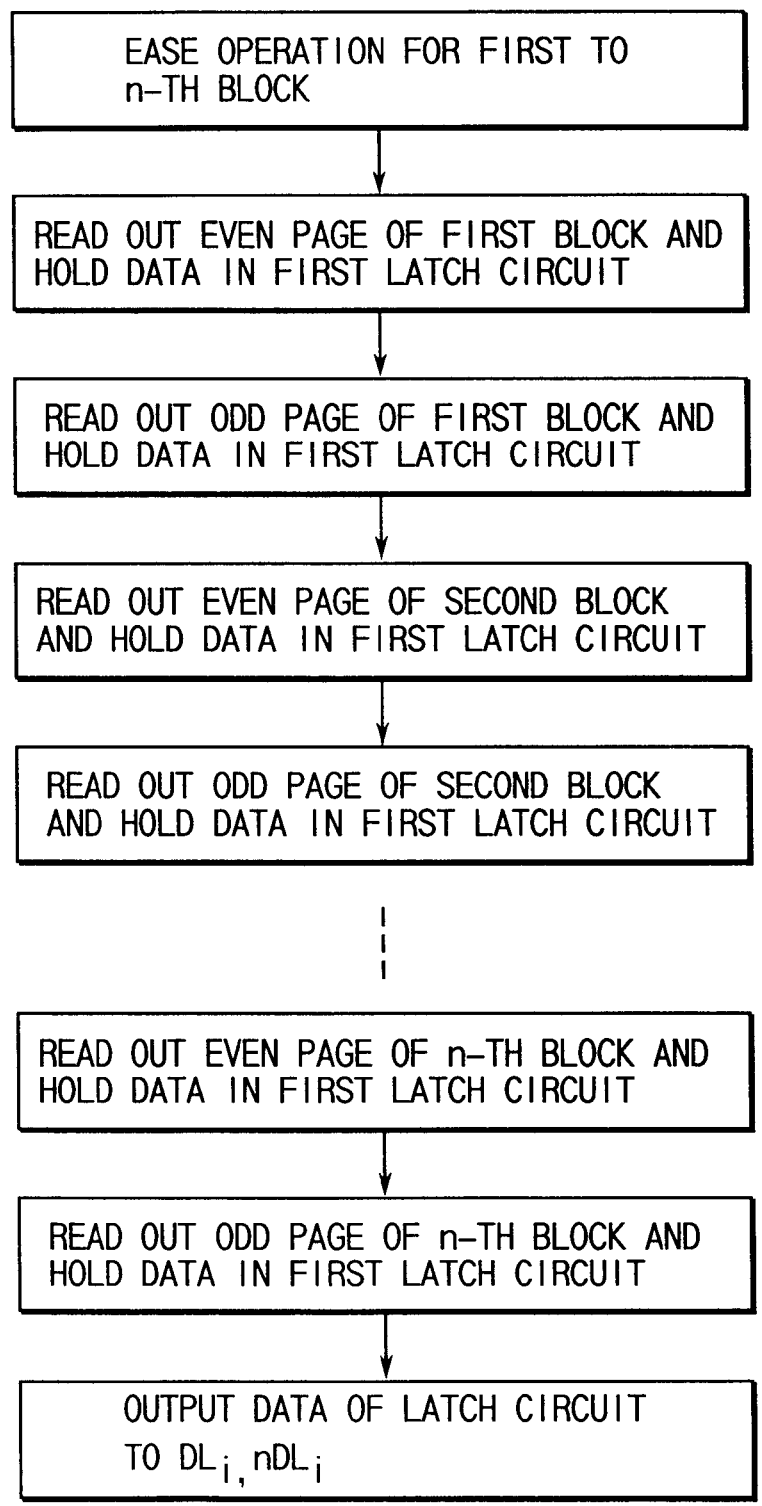
FIG. 19 is a flowchart for illustrating the erase verify read operation.

As described above, in this invention, when a plurality of blocks are simultaneously subjected to the erase operation, read data is sequentially read to the first latch circuit at the time of erase verify read as shown in FIG. 19. Since data may be output to DLi, nDLi only once or simultaneously detected after data items of all of the blocks are read to the first latch circuit, the erase verify read can be effected at high speed.

Embodiment 3

(1) FIGS. 31, 32

An EEPROM of this example includes a memory cell array having memory cell groups almost simultaneously selected at the time of erasing and constructed by a preset number of memory cells, bit lines for transferring data with respect to the memory cells, a signal line (node) electrically connectable to the bit lines, and a data circuit for sensing the potential of the signal line to read the state after the erasing of the memory cells and holding the information. Further, the EEPROM of this example performs the logical operation of first data read to the signal line from the first memory cell group and second data read to the signal line from the second memory cell group by the erase verify read.

If the erase state of at least one of the first and second data items is insufficient, the potential of the signal line is set to an insufficient erase level, and if the erase states of both of the first and second data items are sufficient, the potential of the signal line is set to a sufficient erase level.

Figure 31:
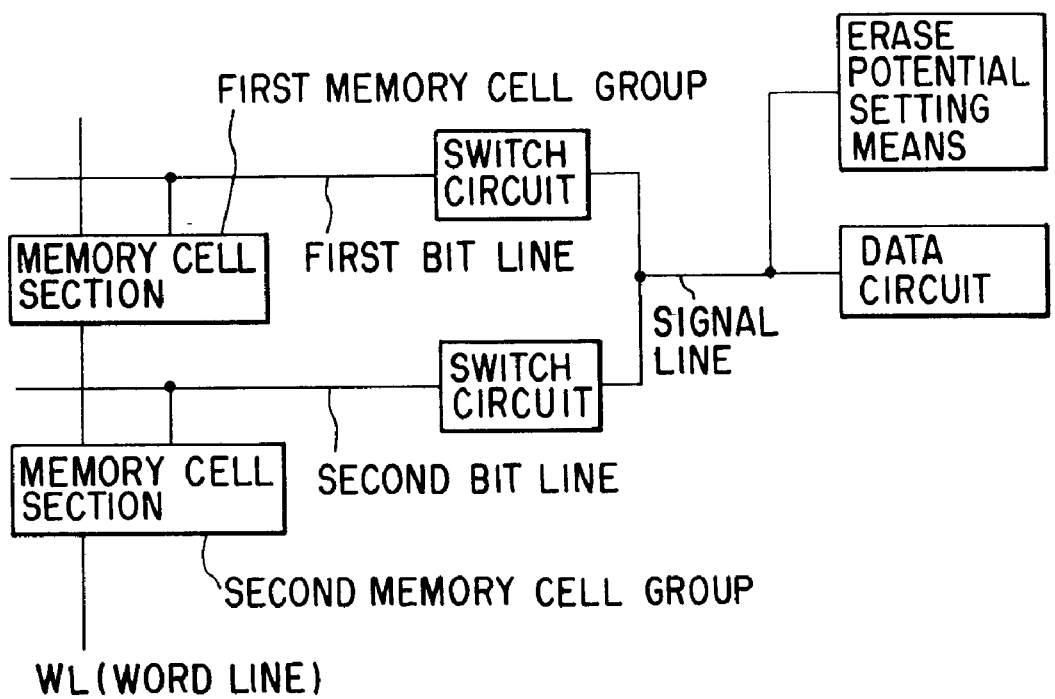
FIG. 31 is a diagram showing a sixth construction of this invention.
Figure 32:
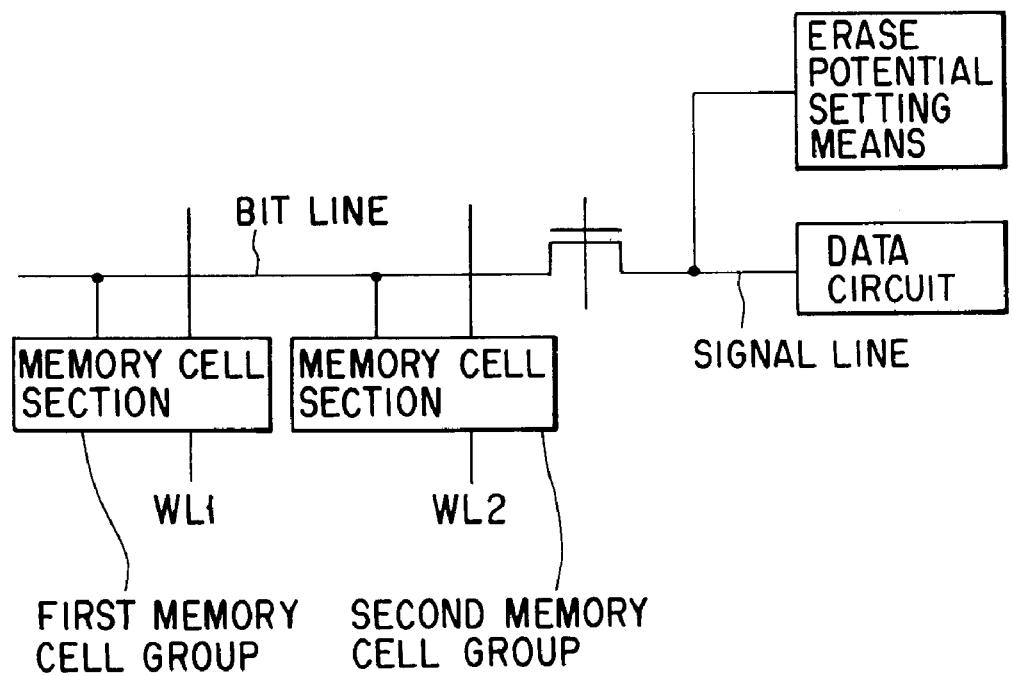
FIG. 32 is a diagram showing a seventh construction of this invention.

As shown in FIG. 31, the first and second memory cell groups may be connected to the same word line and connected to different bit lines. Further, as shown in FIG. 32, the first and second memory cell groups may be connected to different word lines and connected to the same bit line thereof. In addition, a switch circuit may be connected between the signal line and the bit line.

(2) FIGS. 25A, 25B

An EEPROM of this example includes a memory cell array having memory cell groups almost simultaneously selected at the time of erasing and constructed by a preset number of memory cells, a bit line for transferring data with respect to the memory cells, a data circuit for sensing the state set after the erasing of the memory cells and holding the information, and a signal line (node) electrically connectable to the bit line.

Further, the data circuit reads the state of the memory cell by sensing the potential of the signal line. After a plurality of memory cell groups are almost simultaneously subjected to the erase operation, the erase verify read is effected, first data read from the first memory cell group to the signal line is held in the data circuit and second data read from the second memory cell group to the signal line is adjusted based on the first data.

Figure 25A:
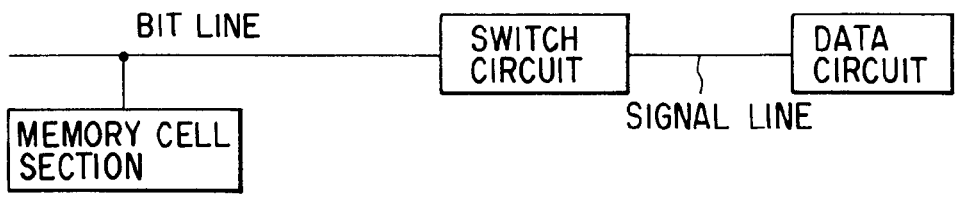
FIGS. 25A and 25B are diagrams showing a first construction of this invention.
Figure 25B:
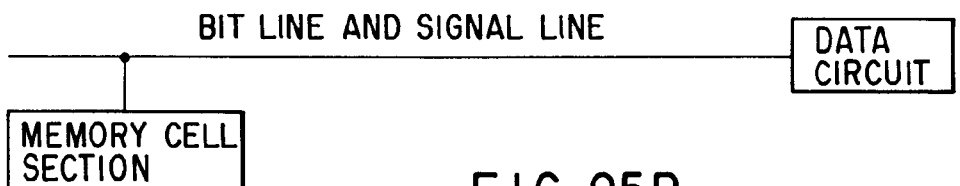

As shown in FIG. 25A, the bit line may be connected to the signal line via a switch circuit. As shown in FIG. 25B, the bit line may be connected directly to the signal line. In the case of FIG. 25B, since the bit line is also used as the signal line, the potential of the bit line is also adjusted when the potential of the signal line is adjusted based on the first data at the time of erase verify read for the second memory cell group.

Of course, in the case of FIG. 25A, the potential of the bit line is adjusted by turning ON the switching circuit when the potential of the signal line is adjusted based on the first data at the time of erase verify read for the second memory cell group.

(3) FIG. 26

An EEPROM of this example includes a memory cell array having memory cell groups almost simultaneously selected at the time of erasing and constructed by a preset number of memory cells, bit lines for transferring data with respect to the memory cells, a data circuit for sensing the state set after the erasing of the memory cells and holding the information, and a signal line (node) electrically connectable to the bit line.

Further, the data circuit reads the state of the memory cell by sensing the potential of the signal line. After a plurality of memory cell groups are almost simultaneously subjected to the erase operation, the erase verify read is effected, first data read from the first memory cell group to the signal line is held in the data circuit and second data read from the second memory cell group to the signal line is adjusted based on the first data.

A plurality of memory cell groups include a memory cell group having word lines connected to the memory cells in another memory cell group and connected to different bit lines.

Figure 26:
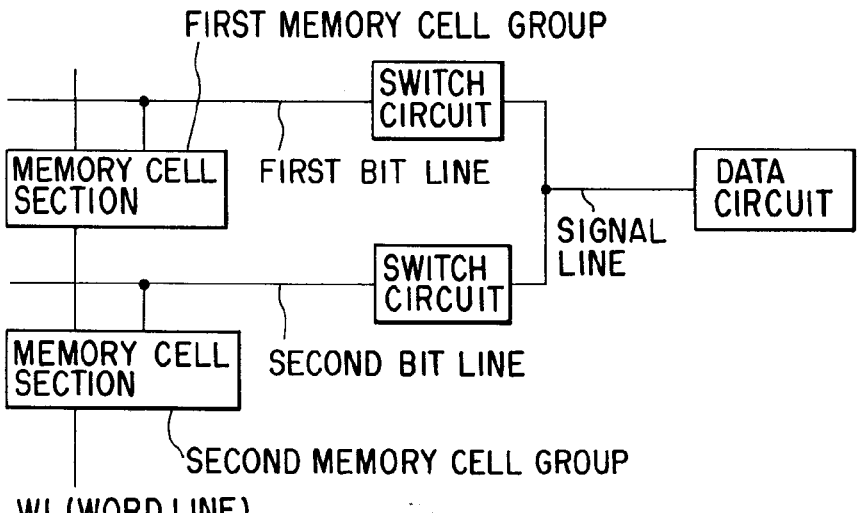
FIG. 26 is a diagram showing a second construction of this invention.

For example, assume that the circuit construction as shown in FIG. 26 is provided. In FIG. 26, switch circuits can be omitted. For example, the verify read of the first block connected to the bit line BLE shown in FIG. 20 is effected and first data read is held in the first latch circuit shown in FIG. 20. After this, it is connected to the bit line BLO and the verify read is effected for the second block which commonly uses the word line with the first block and second data read is transferred to the node N4 shown in FIG. 20.

After the second data of the node N4 is adjusted based on the first data held in the first latch circuit, data of the node N4 is held in the first latch circuit.

(4) FIG. 27

An EEPROM of this example includes a memory cell array having memory cell groups almost simultaneously selected at the time of erasing and constructed by a preset number of memory cells, a bit line for transferring data with respect to the memory cells, a data circuit for sensing the state set after the erasing of the memory cells and holding the information, and a signal line (node) electrically connectable to the bit line.

Further, the data circuit reads the state of the memory cell by sensing the potential of the signal line. After a plurality of memory cell groups are almost simultaneously subjected to the erase operation, the erase verify read is effected, first data read from the first memory cell group to the signal line is held in the data circuit and second data read from the second memory cell group to the signal line is adjusted based on the first data.

A plurality of memory cell groups include a memory cell group connected to word lines different from word lines connected to the memory cells in another memory cell group and connected to the same bit line thereof.

Figure 27:
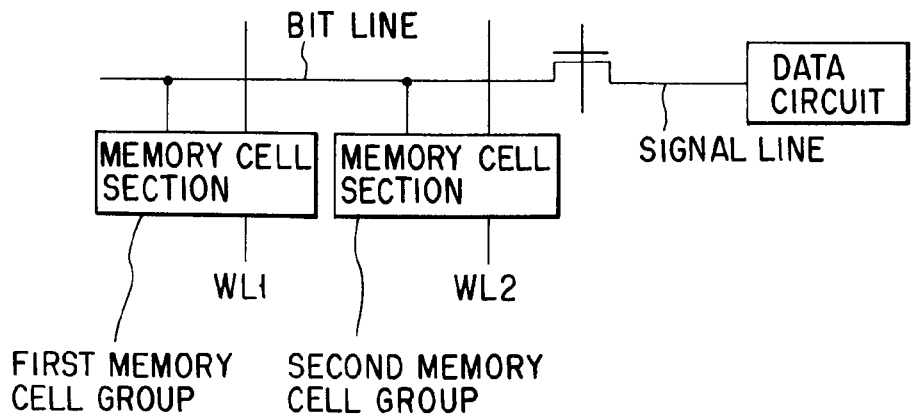
FIG. 27 is a diagram showing a third construction of this invention.

For example, the circuit construction as shown in FIG. 27 is provided. In FIG. 27, a switch circuit (n-channel MISFET) can be omitted. For example, the verify read of the first block connected to the bit line BLE shown in FIG. 20 is effected and first data read is held in the first latch circuit shown in FIG. 20.

After this, the verify read for the second block which is different from the first block is effected and second data read is transferred to the node N4 of FIG. 20. After the second data of the node N4 is adjusted based on the first data held in the first latch circuit, data of the node N4 is held in the first latch circuit.

(5) An EEPROM of this example includes a memory cell array having memory cell groups almost simultaneously selected at the time of erasing and constructed by a preset number of memory cells, bit lines for transferring data with respect to the memory cells, a data circuit for sensing the state set after the erasing of the memory cells and holding the information, and a signal line (node) electrically connectable to the bit line.

Further, the data circuit reads the state of the memory cell by sensing the potential of the signal line. After a plurality of memory cell groups are almost simultaneously subjected to the erase operation, the erase verify read is effected, first data read from the first memory cell group to the signal line is held in the data circuit and second data read from the second memory cell group to the signal line is adjusted based on the first data held in the data circuit.

For example, if at least one of the first and the second data items indicates the insufficient erase state, data indicating the insufficient erase state is output, and if both of the first and second data items indicate the sufficient erase state, data indicating the sufficient erase state is output.

For example, the verify read is effected for the first block connected to the bit line BLE of FIG. 20 and first data read is held in the first latch circuit shown in FIG. 20. After this, the verify read is effected for the second block and second data read is transferred to the node N4 of FIG. 20.

Then, if at least one of the first and the second data items indicates the insufficient erase state, the potential of the node N4 is set to the insufficient erase level, and if both of the first and second data items indicate the sufficient erase state, the potential of the node N4 is set to the sufficient erase level. Data of the node N4 is held in the first latch circuit.

(6) An EEPROM of this example includes a memory cell array having memory cell groups almost simultaneously selected at the time of erasing and constructed by a preset number of memory cells, bit lines for transferring data with respect to the memory cells, a data circuit for sensing the state set after the erasing of the memory cells and holding the information, and a signal line (node) electrically connectable to the bit lines.

Further, the data circuit reads the state of the memory cell by sensing the potential of the signal line. After a plurality of memory cell groups are almost simultaneously subjected to the erase operation, the erase verify read is effected, first data read from the first memory cell group to the signal line is held in the data circuit and second data read from the second memory cell group to the signal line is adjusted based on the first data.

That is, if at least one of the first and the second data items indicates the insufficient erase state, data indicating the insufficient erase state is output, and if both of the first and second data items indicate the sufficient erase state, data indicating the sufficient erase state is output.

The verify read for the m-th (m is a natural number equal to or larger than 2 and equal to or less than n) memory cell group is effected, and if the erase state of at least one of the first to m-th data items is insufficient, the potential of the signal line is set to the insufficient erase level, and if the erase states of all of the first to m-th data items are sufficient, the potential of the signal line is set to the sufficient erase level.

The verify read for the n-th memory cell group is effected, and if the erase state (or write state) of at least one of the first to n-th data items is insufficient, the potential of the signal line is set to the insufficient erase level, and if the erase states of all of the first to n-th data items are sufficient, the potential of the signal line is set to the sufficient erase level.

For example, the verify read for the first block connected to the bit line BLE shown in FIG. 20 is effected and first data read is held in the first latch circuit of FIG. 20. After this, the verify read for the first block connected to the bit line BLO is effected and second data read is transferred to the node N4 of FIG. 20.

Then, if at least one of the first and second data items indicates the insufficient erase state, the node N4 is set to the insufficient erase level, and if both of the first and second data items indicate the sufficient erase state, the node N4 is set to the sufficient erase level. After this, data of the node N4 is held in the first latch circuit.

Next, the verify read for the second block connected to the bit line BLE is effected and third data read is transferred to the node N4 of FIG. 20. Then, if at least one of the first, second and third data items indicates the insufficient erase state, the node N4 is set to the insufficient erase level, and if all of the first, second and third data items indicate the sufficient erase state, the node N4 is set to the sufficient erase level. After this, data of the node N4 is held in the first latch circuit.

Further, the verify read for the second block connected to the bit line BLO is effected and fourth data read is transferred to the node N4 of FIG. 20. Then, if at least one of the first, second, third and fourth data items indicates the insufficient erase state, the node N4 is set to the insufficient erase level, and if all of the first, second, third and fourth data items indicate the sufficient erase state, the node N4 is set to the sufficient erase level. After this, data of the node N4 is held in the first latch circuit.

(7) FIGS. 28, 29

An EEPROM of this example includes a memory cell array having memory cell groups almost simultaneously selected at the time of erasing and constructed by a preset number of memory cells, bit lines for transferring data with respect to the memory cells, a data circuit for sensing the state set after the erasing of the memory cells and holding the information, and a signal line (node) electrically connectable to the bit lines.

The data circuit includes a plurality of latch circuits and the data circuit reads the state of the memory cell by sensing the potential of the signal line. After a plurality of memory cell groups are almost simultaneously subjected to the erase operation, the erase verify read is effected, first data read from the first memory cell group to the signal line is held in the first latch circuit of the data circuit and second data read from the second memory cell group is held in the second latch circuit of the data circuit.

Figure 28:
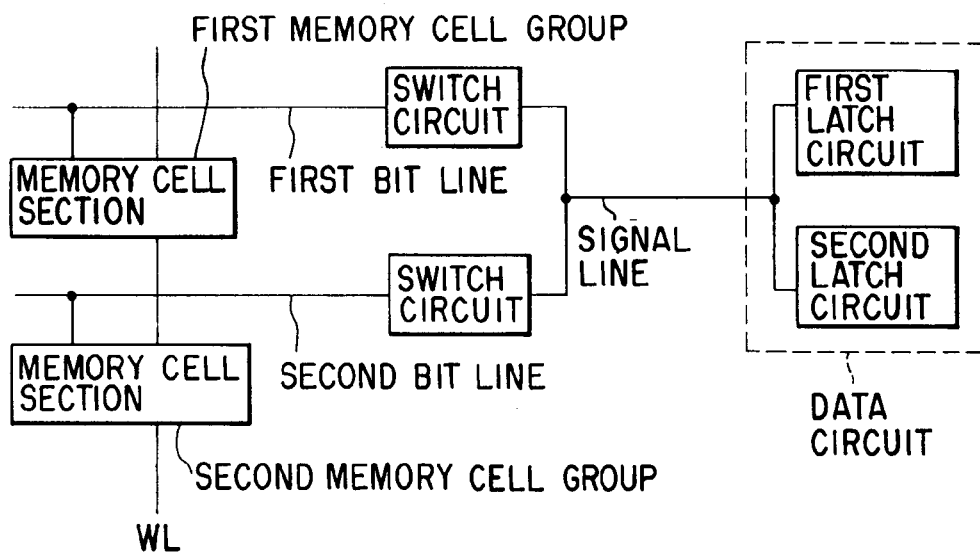
FIG. 28 is a diagram showing a fourth construction of this invention.
Figure 29:
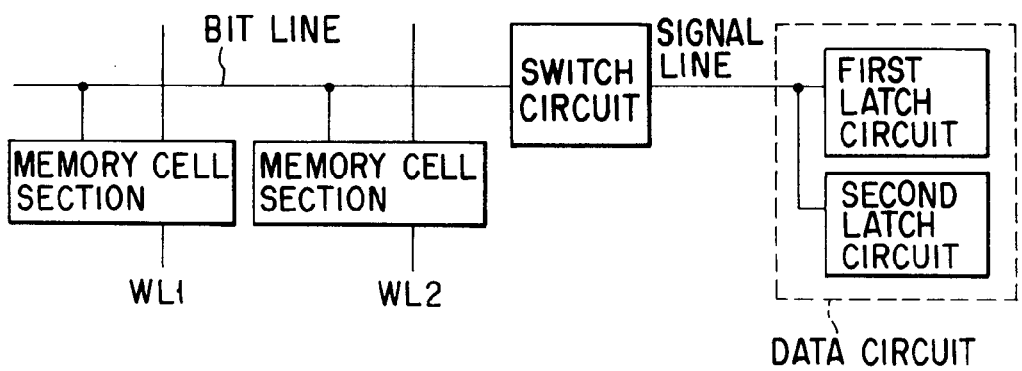
FIG. 29 is a diagram showing a fifth construction of this invention.

The above construction is shown in FIGS. 28, 29, for example. In FIGS. 28, 29, switch circuits may be omitted. If the switch circuits are omitted, the bit line and the signal line are set at the same potential. If the switch circuits are present, the switch circuit may be turned ON when the potential of the bit line is adjusted.

(8) FIG. 29

An EEPROM of this example includes a memory cell array having memory cell groups almost simultaneously selected at the time of erasing and constructed by a preset number of memory cells, a bit line for transferring data with respect to the memory cells, a data circuit for sensing the state set after the erasing of the memory cells and holding the information, and a signal line (node) electrically connectable to the bit line.

The data circuit includes a plurality of latch circuits and the data circuit reads the state of the memory cell by sensing the potential of the signal line. After a plurality of memory cell groups are almost simultaneously subjected to the erase operation, the erase verify read is effected, first data read from the first memory cell group to the signal line is held in the first latch circuit of the data circuit and second data read from the second memory cell group is held in the second latch circuit of the data circuit.

Further, a plurality of memory cell groups include a memory cell connected to a word line different from that of the memory cell of another memory cell group and connected to the same bit line thereof.

Therefore, the above construction is shown in FIG. 29, for example. Of course, in FIG. 29, a switch circuit can be omitted. For example, the verify read for the first block connected to the bit line BLE of FIG. 20 is effected and first data road is held in the first latch circuit of FIG. 20. After this, the verify read for the second block connected to the bit line BLE is effected and second data read is held in the second latch circuit of FIG. 20.

Then, the first data held in the first latch circuit and the second data held in the second latch circuit are output via the I/O lines.

(9) FIG. 28

An EEPROM of this example includes a memory cell array having memory cell groups almost simultaneously selected at the time of erasing and constructed by a preset number of memory cells, bit lines for transferring data with respect to the memory cells, a data circuit for sensing the state set after the erasing of the memory cells and holding the information, and a signal line (node) electrically connectable to the bit lines.

The data circuit includes a plurality of latch circuits and the data circuit reads the state of the memory cell by sensing the potential of the signal line. After a plurality of memory cell groups are almost simultaneously subjected to the erase operation, the erase verify read is effected, first data read from the first memory cell group to the signal line is held in the first latch circuit of the data circuit and second data read from the second memory cell group is held in the second latch circuit of the data circuit.

Further, a plurality of memory cell groups include a memory cell connected to the same word line as that of the memory cell of another memory cell group and connected to a different bit line thereof.

Therefore, the above construction is shown in FIG. 28, for example. Of course, in FIG. 28, switch circuits can be omitted. For example, the verify read for the first block connected to the bit line BLE of FIG. 20 is effected and first data read is held in the first latch circuit of FIG. 20. After this, the verify read for the second block connected to the bit line BLO is effected and second data read is held in the second latch circuit of FIG. 20.

Then, the first data held in the first latch circuit and the second data held in the second latch circuit are output via the I/O lines.

(10) An EEPROM of this example includes a memory cell array having memory cell groups almost simultaneously selected at the time of erasing and constructed by a preset number of memory cells, bit lines for transferring data with respect to the memory cells, a data circuit for sensing the state set after the erasing of the memory cells and holding the information, and a signal line (node) electrically connectable to the bit lines.

The data circuit includes a plurality of latch circuits and the data circuit reads the state of the memory cell by sensing the potential of the signal line. After a plurality of memory cell groups are almost simultaneously subjected to the erase operation, the erase verify read is effected, first data read from the first memory cell group to the signal line is held in the first latch circuit of the data circuit and second data read from the second memory cell group is held in the second latch circuit of the data circuit.

The verify read for the m-th (m is a natural number equal to or larger than 2) memory cell group is effected and the potential of the signal line to which m-th data is read is held in the m-th latch circuit of the data circuit.

(11) The data circuit has a simultaneous detection circuit for simultaneously detecting that all of the memory cells which are subjected to the erase operation are set in the sufficiently erased state. The simultaneous detection circuit may be the transistor QNL9 of FIG. 20, for example.

(12) The memory cell group includes memory cells in the block as shown in FIG. 5, for example.

Embodiment 4

In the examples described above, the multi-level NAND type EEPROMs are explained, but this invention is not limited to these devices and can also be applied to a 2-level type EEPROM, for example.

Figure 33:
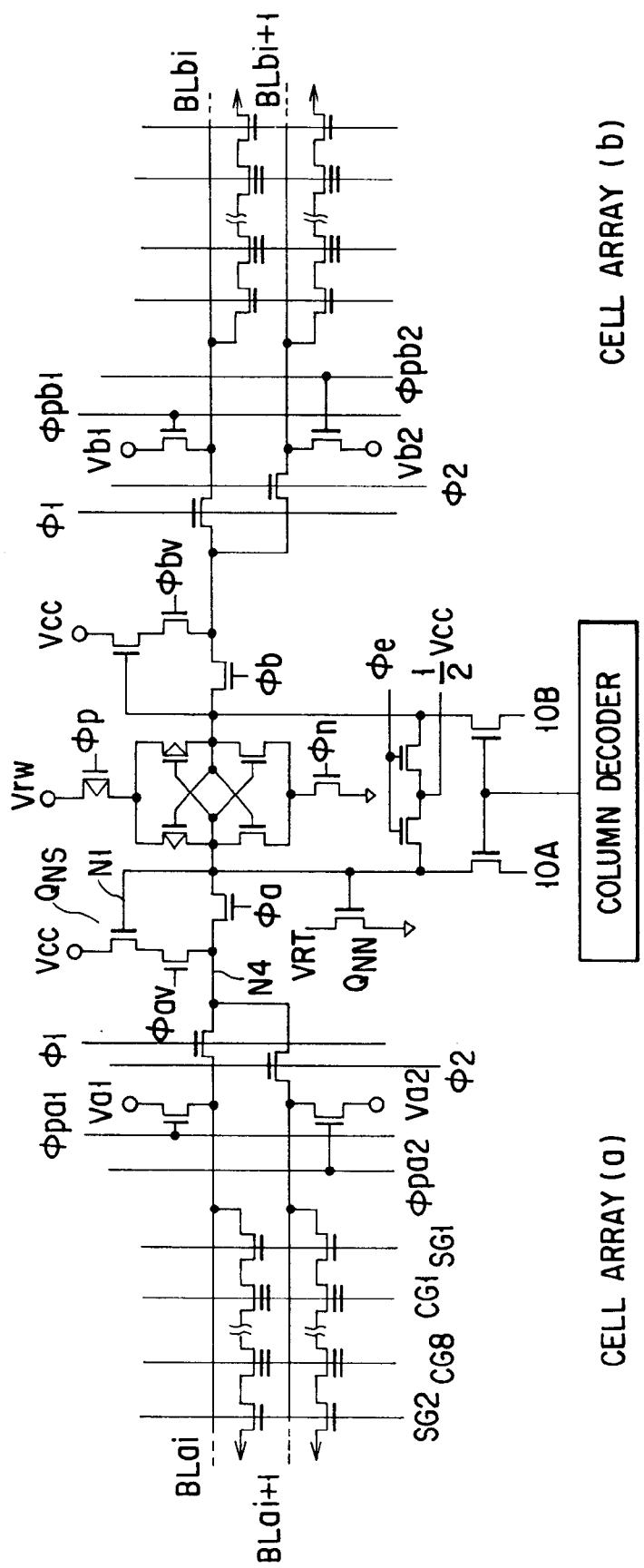
FIG. 33 is a diagram showing the construction of a data circuit of a memory of this invention.

A memory of open bit line configuration as shown in FIG. 33 in which two bit lines are connected to one data circuit is explained as an example. The read operation and write operation of this memory are described in detail in the known reference "T. Tanaka et al,; IEEE Journal of Solid-State Circuits vol.29, No. 11, pp.1366–1373, November 1994".

The operation of the memory is explained below with reference to the timing diagram of FIG. 34.

The verify read is first effected for an even page of the first block (for example, memory cells connected to a bit line BLai in FIG. 33) and read data is held in the latch circuit.

Next, the verify read is effected for an odd page (for example, memory cells connected to a bit line BLai+1 in FIG. 33) and read data is held in the latch circuit.

If the select gate lines SG1, SG2 are set to Vcc and the word lines CG1 to CG8 are set to 0 V at the time t1y after the bit line BLai is precharged to 1.8 V and the bit line BLbi is precharged to 1.5 V, the bit line becomes lower than the dummy bit line potential 1.5 V when the erase state of the memory cell is sufficient, and the bit line is kept at 1.8 V when the erase state of the memory cell is insufficient. At time t2y, φ1 is set to Vcc and the bit line potential and dummy bit line potential are transferred into the data circuit. After this, when φa becomes "High", data is transferred and sensed. Thus, data of the even page is held in the latch circuit.

During the operation of reading out data of the even page, the bit line BLai+1, BLbi+1 are kept at 0 V in order to reduce the capacitive coupling noise between the bit lines. As the result of the above verify read, the node N1 becomes "High" in the case of insufficient erase, and the node N1 becomes "Low" in the case of sufficient erase.

Next, the verify read is effected for an odd page (for example, memory cells connected to a bit line BLai+1 in FIG. 33). If the select gate lines SG1, SG2 are set to Vcc and the word lines CG1 to CG8 are set to 0 V at the time t5y after the bit line BLai+1 is precharged to 1.8 V and the dummy bit line BLbi+1 is precharged to 1.5 V, the bit line becomes equal to or lower than the dummy bit line potential 1.5 V when the erase state of the memory cell is sufficient, and the bit line is kept at 1.8 V when the erase state of the memory cell is insufficient. At the time t6y, φ2 is set to Vcc and the bit line potential is transferred into the data circuit. After this, φav becomes "High" at the time t7y.

In the case of sufficient erase as the result of read of the even page, the n-channel transistor QNS is turned OFF since the "Low" potential is latched in the node N1 and the potential of the node N4 is kept unchanged. That is, if the erase state of the odd page is insufficient, the node N4 become "High" and if the erase state of odd page is sufficient, the node N4 becomes "Low".

On the other hand, in the case of insufficient erase as the result of read of the even page, the n-channel transistor QNS is turned ON since the "High" potential is latched in the node N1 and the potential of the node N4 becomes "High" irrespective of data of the odd page.

After this, when φa, φb are set to "High", data is transferred and sensed. During the operation of reading out data of the odd page, the bit line BLai, BLbi are kept at 0 V in order to reduce the capacitive coupling noise between the bit lines.

As the result of the above verify read, the node N1 becomes "High" if at least one memory cell whose erase state is insufficient is present. The node N1 is set to "Low" only when the erase states of both of the even and odd pages are sufficient.

Figure 34:
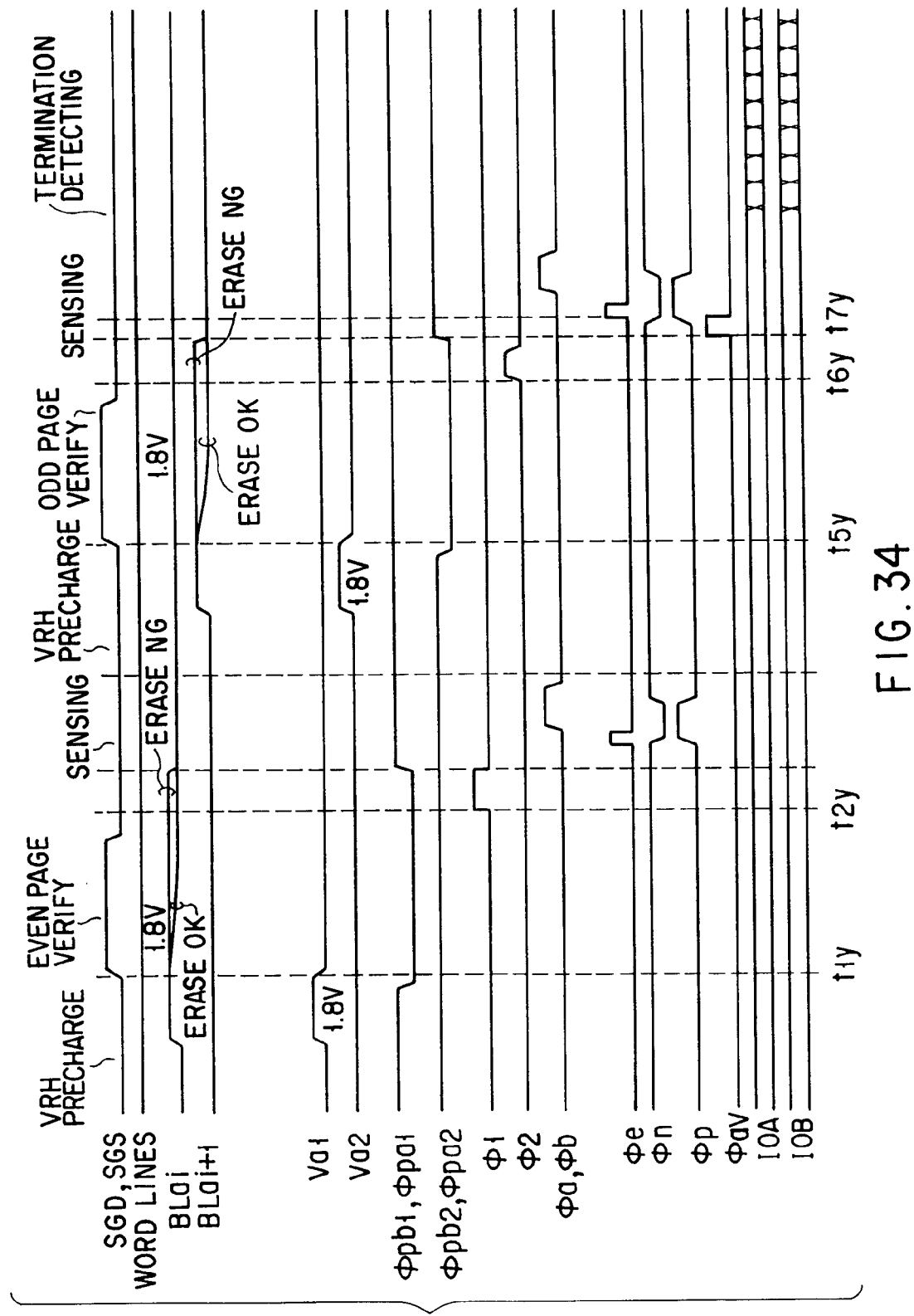
FIG. 34 is a waveform diagram for illustrating the erase verify read operation.

The end of the erase operation is detected by outputting data of the latch circuit to IOU, IOB as shown in FIG. 34, and it may be simultaneously detected by use of an end-of-erase simultaneous detection transistor QNN as shown in FIG. 33, for example.

As described above, after data items of the even and odd pages or data items in the first to n-th blocks as described in the embodiment 2 are read to the first latch circuit, VRT is precharged to Vcc, for example.

In the column containing a memory cell whose erase state is insufficient, the node N1 becomes "High", the n-channel MOS transistor QNN is turned ON and VRT is lowered from the precharged potential. If the erase states of all of the selected memory cells are sufficient, the nodes N1 in all of the columns become "Low". As a result, since the n-channel MOS transistors QNN in all of the data circuits are turned OFF, VRT is kept at the precharged potential and the end of the erase operation is detected.

Figure 21:
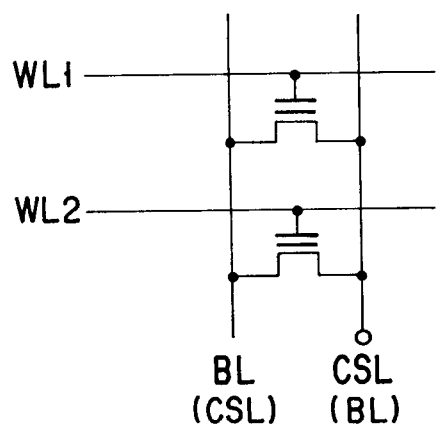
FIG. 21 is a diagram showing the construction of a ground array type cell.
Figure 22:
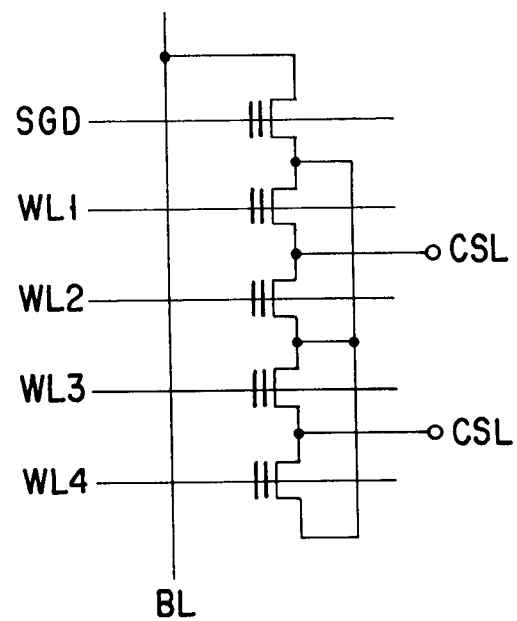
FIG. 22 is a diagram showing the construction of a DINOR cell.
Figure 23:
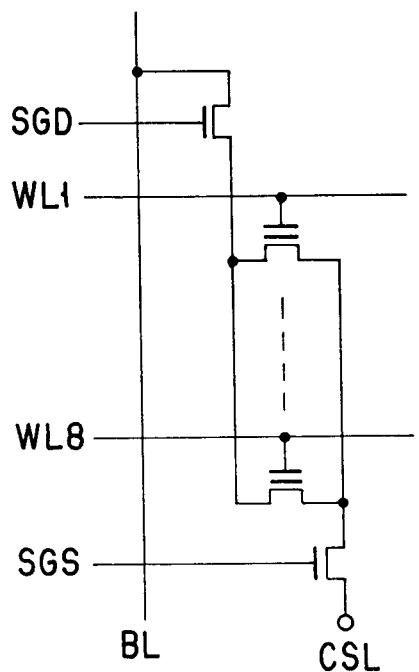
FIG. 23 is a diagram showing the construction of an AND cell.
Figure 24:
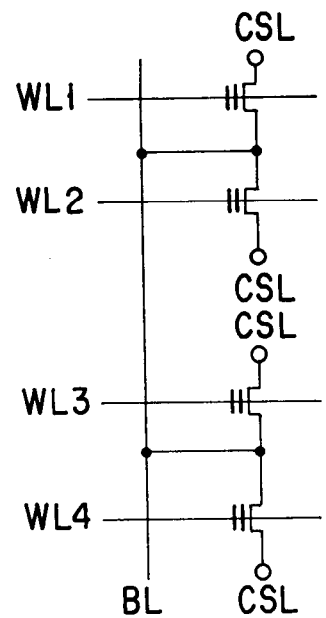
FIG. 24 is a diagram showing the construction of a NOR cell.

Further, this invention can be applied to a NOR type EEPROM as shown in FIG. 24, an AND type EEPROM (K. Kume et al.; IEDM Tech. Dig., Dec. 1992, pp. 991 to 993) as shown in FIG. 23, a DINOR type EEPROM (S. Kobayashi et al.; ISSCC Tech. Dig., 1995, pp.122) as shown in FIG. 22, and an imaginary ground array type EEPROM (R. Cemea et al.; ISSCC Tech. Dig., 1995 pp.126) as shown in FIG. 21 in addition to the NAND type EEPROM as shown in FIG. 8. Further, this invention can be applied to a mask ROM.

Further, this invention can be applied to an EEPROM for storing 3-level, 4-level, 5-level, 8-level or 16-level data in one memory cell.

Embodiment 5

Figure 35:
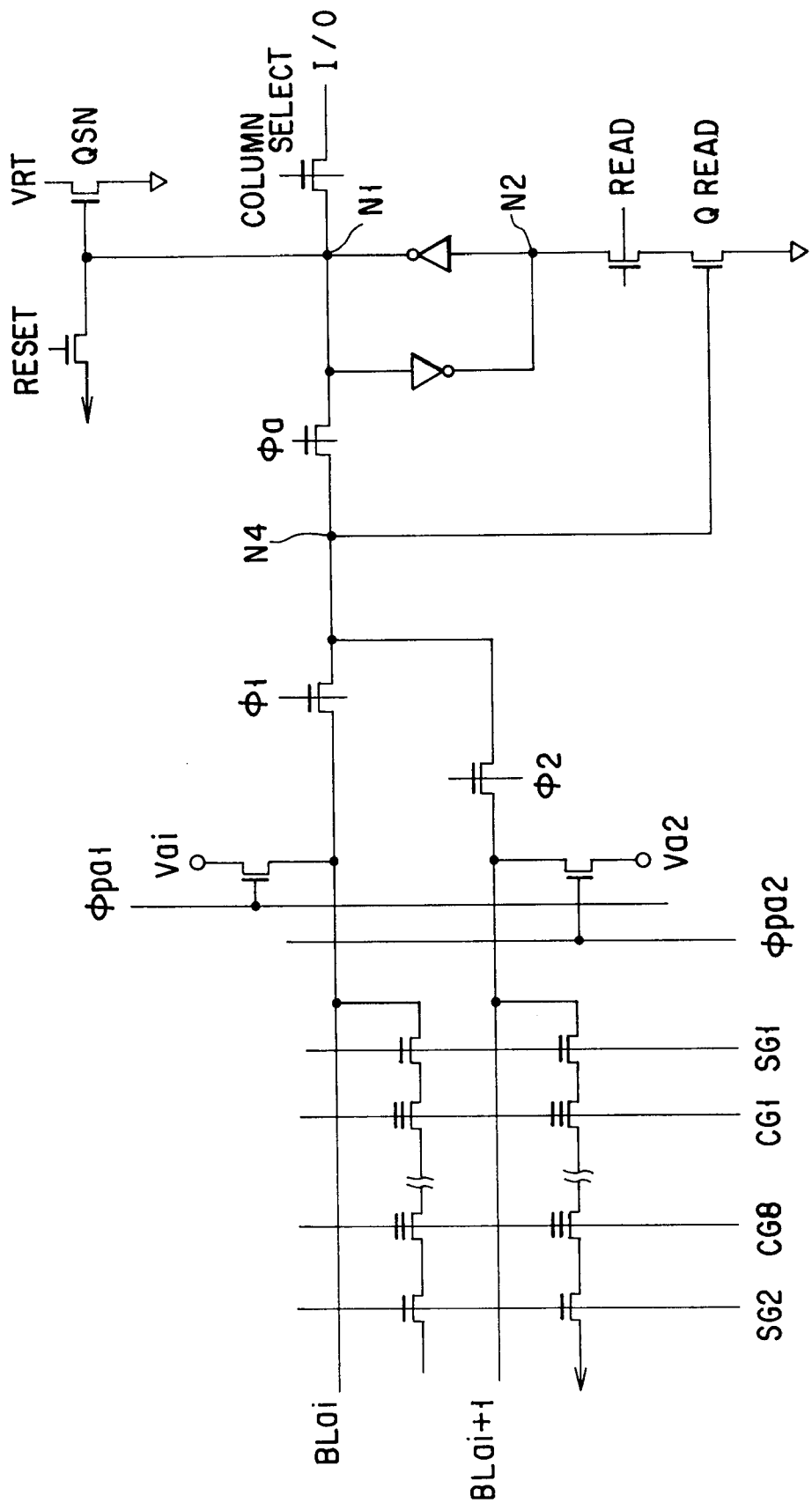
FIG. 35 is a diagram showing the construction of a data circuit of a memory of this invention.
Figure 36:
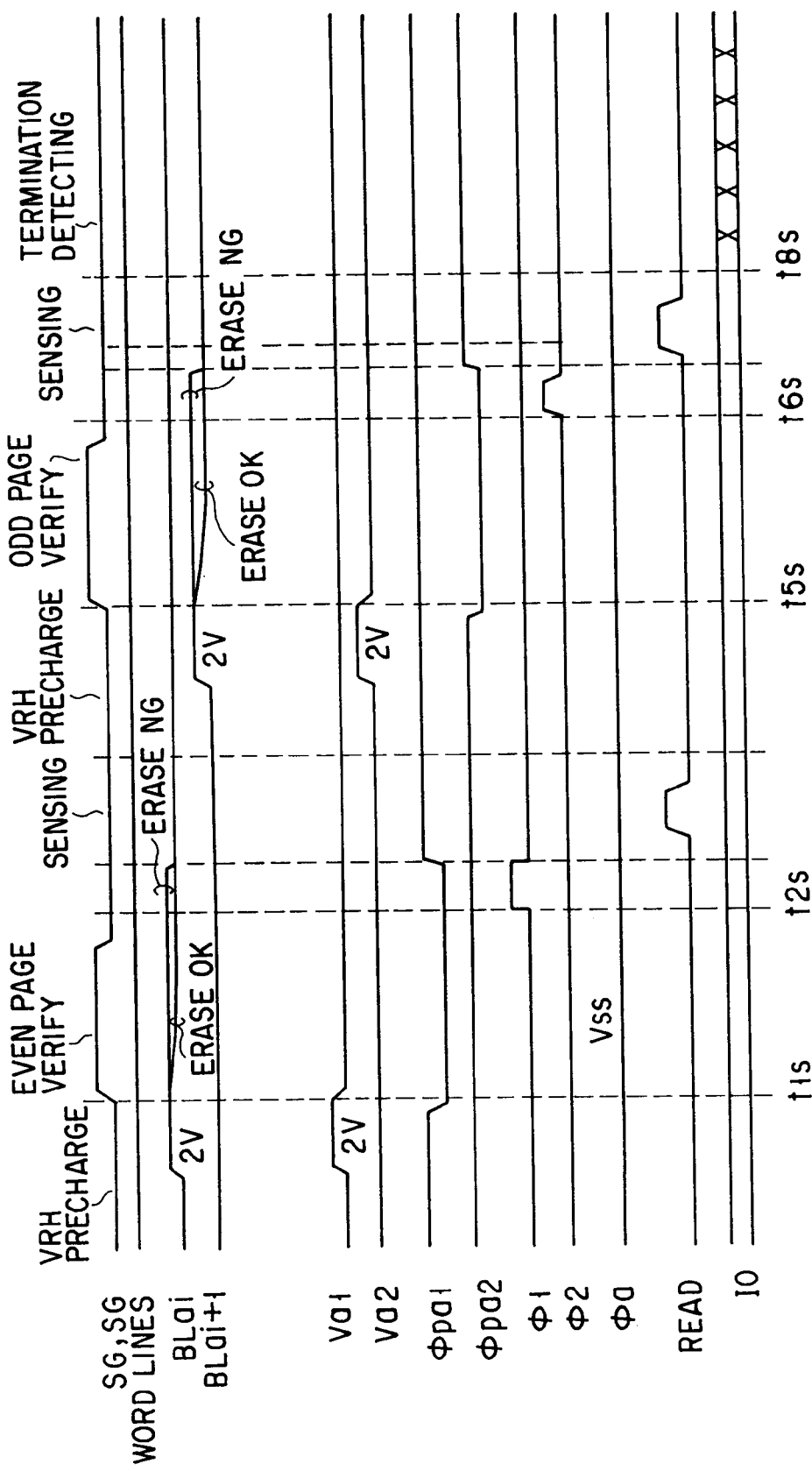
FIG. 36 is a waveform diagram for illustrating the erase verify read operation.

This invention can also be applied to a sense amplifier shown in FIG. 35. The write and read operations thereof are described in detail in "IEEE Journal of Solid-State Circuits vol.30, No. 11, pp. 1157 to 1164, November 1995". FIG. 36 is a timing diagram of the erase verify read.

The verify read is first effected for the even page (for example, memory cells connected to the bit line BLai of FIG. 35) and read data is held in the latch circuit. Then, the verify read is effected for the odd page (for example, memory cells connected to the bit line BLai+1 of FIG. 35) and read data is held in the latch circuit.

First, the node N1 is set to "Low" and the node N2 is set to "High" by setting Reset to "High". If the select gate lines SG1, SG2 are set to Vcc and the word lines CG1 to CG8 are set to 0 V at the time t1s after the bit line BLai is precharged to 2 V, the bit line becomes 0 V when the erase state of the memory cell is sufficient, and the bit line is kept at 2 V when the erase state of the memory cell is insufficient. At the time t2s, φ1 is set to Vcc and the bit line potential and dummy bit line potential are transferred into the data circuit. After this, "Read" becomes "High" and data is sensed.

That is, when the erase state is insufficient, an n-channel transistor Qread is turned ON, the node N2 is set to "Low" and the node N1 is set to "High". In the case of sufficient erase state, the n-channel transistor Qread is turned OFF and the node N2 is kept at "High". Thus, data of the even page is held in the latch circuit. During the operation of reading out data of the even page, the bit line BLai+1 is kept at 0 V in order to reduce the capacitive coupling noise between the bit lines.

Next, the verify read is effected for the odd page (for example, memory cells connected to a bit line BLai+1 of FIG. 35). If the select gate lines SG1, SG2 are set to Vcc and the word lines CG1 to CG8 are set to 0 V at the time t5s after the bit line BLai+1 is precharged to 2 V, the bit line becomes 0 V when the erase state of the memory cell is sufficient, and the bit line is kept at 2 V when the erase state of the memory cell is insufficient. At the time t6s, φ2 is set to Vcc and the bit line potential is transferred into the data circuit. After this, "Read" becomes "High" and data is sensed.

That is, when the erase state is insufficient, the n-channel transistor Qread is turned ON, the node N2 is set to "Low" and the node N1 is set to "High". In the case of sufficient erase state, the n-channel transistor Qread is turned OFF and the node N2 is kept at "High". During the operation of reading out data of the odd page, the bit line BLai is kept at 0 V in order to reduce the capacitive coupling noise between the bit lines.

If at least one of the memory cells whose erase state is insufficient is present in the even and odd pages as the result of the verify read operation, N1 is set to "High" and N2 is set to "Low". Only when the sufficient erase state is attained in both of the even and odd pages, N1 becomes "Low" and N2 becomes "High".

The end of the erase operation can be detected by outputting data of the latch circuit to the I/O line, but as shown in FIG. 35, the end of the erasing operation can be simultaneously detected by use of an end-of-erase simultaneous detection transistor QSN, for example. As described above, after data items of the even and odd pages are read to the first latch circuit, VRT is first precharged to Vcc. In the column containing a memory cell whose erase state is insufficient, the node N1 is set to "High", the n-channel MOS transistor QSN is turned ON and VRT is lowered from the precharged potential. Only when the erase states of all of the selected memory cells are sufficient, the nodes N1 in all of the columns are set to "Low". As a result, since the n-channel MOS transistors QSN in all of the data circuits are turned OFF, VRT is kept at the precharged potential and the end of the erase operation is detected.

As described above, according to the nonvolatile semiconductor memory device of this invention, in a memory cell array in which a plurality of bit lines are commonly used by one sense amplifier, memory cells connected to the plurality of bit lines are almost simultaneously subjected to the erase operation at the erasing time and the erase verify read is effected for the memory cells connected to the respective bit lines after erasing, and in this case, time required for the erase verify read can be significantly reduced. Further, in order to prevent an increase in the area of the peripheral circuit in a multi-level memory, time required for the erase verify read cannot be made long in a case where a plurality of bit lines are commonly used by one latch circuit.

The present invention can be applied to a nonvolatile memory in which electrons move from each floating gate into the substrate at erase mode, and also to a nonvolatile memory in which electrons move from each floating gate into the substrate at write mode.

Additional advantages and modifications will readily occurs to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A verify read method comprising the steps of:
   performing an erasing step of a first memory cell and a second memory cell;
   reading out a first data of the first memory cell;
   transferring the first data from the first memory cell to a first latch circuit through a first bit line and a common node;
   reading out a second data of the second memory cell; and
   transferring the second data front the second memory cell to a second latch circuit through a second bit line and the common node, the second bit line being adjacent to the first bit line.

2. The verify read method according to claim 1, further comprising the steps of:
   outputting the first data stored in the first latch circuit to a first data line and outputting the second data stored in the second latch circuit to a second data line.

3. The verify read method according to claim 1, further comprising the steps of:
   detecting whether an erasing step of the first memory cell is completed based on the first data stored in the first latch circuit and detecting whether the erasing step of the second memory cell is completed based on the second data stored in the second latch circuit.

4. The verify read method according to claim 1, wherein the first and second latch circuit temporarily store read or program data while reading or writing to the first or second memory cell.

5. The verify read method according to claim 2, wherein the second bit line is set at a fixed potential while reading the first data and the first bit line is set at the fixed potential while reading the second data.

6. The verify read method according to claim 5, wherein the fixed potential is a ground potential or a power supply potential.

7. The verify read method according to claim 1, wherein the first and second memory cells are connected to one word line.

8. The verify read method according to claim 2, wherein the first and second memory cells are connected to one word line.

9. A verify read method comprising steps of:
   performing an erasing step of a first memory cell in a first block and a second memory cell in a second block;
   reading out a first data of the first memory cell;
   transferring the first data to a first latch circuit through a common node;
   reading out a second data of the second memory cell; and
   transferring the second data to a second latch circuit through the common node, wherein the first and second memory cells are connected to different word lines.

10. The verify read method according to claim 9, further comprising the steps of:
    outputting the first data stored in the first latch circuit to a first data line and outputting the second data stored in the second latch circuit to a second data line.

11. The verify read method according to claim 9, further comprising the steps of:
    detecting whether the erasing step of the first memory cell is completed based on the first data stored in the first latch circuit and detecting whether the erasing step of the second memory cell is completed based on the second data stored in the second latch circuit.

12. The verify read method according claim 9, wherein the first and second latch circuit temporarily store read or program data while reading or writing to the first or second memory cell.

13. The verify read method according to claim 9, wherein the first data is transferred from the first memory cell to a first bit line and the second data is transferred from the second memory cell to the first bit line.

14. The verify read method according to claim 13, wherein the first data is transferred from the first bit line to the first latch circuit through the common node and the second data is transferred from the first bit line to the second latch circuit through the common node.

15. The verify read method according to claim 14, wherein a second bit line adjacent to the first bit line is set at a fixed potential while reading the first data and the second data.

16. The verify read method according to claim 15, wherein the fixed potential is a ground potential or a power supply potential.

17. The verify read method according to claim 9, wherein the first and second memory cells are connected to different word lines.

18. A verify read method comprising the steps of:
   performing an erasing step of a first memory cell and a second memory cell;
   reading out a first data of the first memory cell;
   transferring the first data to a latch circuit;
   reading out a second data of the second memory cell;
   generating a third data based on the first data and the second data; and
   replacing the first data stored in the latch circuit with the third data, whereby the third data is stored in the latch circuit.

19. The verify read method according to claim 18, wherein the third data is set at a first value if at least one of the first data and the second data has the first value, the first value indicating that an erasing step of the first and second memory cells is incomplete, and the third data is set at a second value if both of the first data and the second data have the second value, the second value indicating that the erasing step of the first and second memory cells is complete.

20. The verify read method according to claim 19, further comprising a step of detecting whether the erasing step is completed based on the third data.

21. The verify read method according to claim 18, wherein the first data is read from the first memory cell and the second data is read from the second memory cell.

22. The verify read method according to claim 21, wherein the first data is transferred from the first memory cell to a first bit line and the second data is transferred from the second memory cell to a second bit line adjacent to the first bit line.

23. The verify read method according to claim 22, wherein the second bit line is set at a fixed potential while reading the first data and the first bit line is set at the fixed potential while reading the second data.

24. The verify read method according to claim 23, wherein the fixed potential is a ground potential or a power supply potential.

25. The verify read method according to claim 24, wherein the first and second memory cells are connected to different word lines.

26. The verify read method according to claim 18, wherein the first and second memory cells are connected to one word line.

27. A verify read method comprising the steps of:
   performing an erasing step of a first memory cell in a first block and a second memory cell in a second block;
   reading out a first data of the first memory cell;
   transferring the first data to a latch circuit;
   reading out a second data of the second memory cell;
   generating a third data based on the first data and the second data; and
   replacing the first data stored in the latch circuit with the third data, whereby the third data is stored in the latch circuit.

28. The verify read method according to claim 27, wherein the third data is set at a first value if at least one of the first data and the second data has the first value, the first value indicating that the erasing step of the first and second memory cells is incomplete, and the third data is set at a second value if both the first data and the second data have the second value, the second value indicating that the erasing step of the first and second memory cells is complete.

29. The verify read method according to claim 28, further comprising a step of detecting whether the erasing step is complete based on the third data.

30. The verify read method according claim 27, wherein the first data is transferred from the first memory cell to a first bit line and the second data is transferred from the second memory cell to the first bit line.

31. The verify read method according to claim 30, wherein a second bit line adjacent to the first bit line is set at a fixed potential while reading the first and second data.

32. The verify read method according to claim 31, wherein the fixed potential is a ground potential or a power supply potential.

33. The verify read method according to claim 32, wherein the first and second memory cells are connected to different word lines.

34. The verify read method according to claim 27, wherein the first and second memory cells are connected to different word lines.

* * * * *

UNITED STATES PATENT AND TRADEMARK OFFICE
CERTIFICATE OF CORRECTION

PATENT NO.    : 6,301,153 B1
DATED         : October 9, 2001
INVENTOR(S)   : Ken Takeuchi et al.

Page 1 of 1

It is certified that error appears in the above-identified patent and that said Letters Patent is hereby corrected as shown below:

<u>Column 23,</u>
Line 64, delete "front" insert -- from --

<u>Column 24,</u>
Line 17, delete "2" insert -- 1 --

<u>Column 26,</u>
Line 40, delete "32" insert -- 30 --

Signed and Sealed this

Twenty-fourth Day of December, 2002

JAMES E. ROGAN
*Director of the United States Patent and Trademark Office*